United States Patent
Kawabata et al.

(10) Patent No.: US 7,586,183 B2
(45) Date of Patent: Sep. 8, 2009

(54) MULTILEVEL SEMICONDUCTOR MODULE AND METHOD FOR FABRICATING THE SAME

(75) Inventors: Takeshi Kawabata, Osaka (JP); Motoaki Satou, Kyoto (JP); Toshiyuki Fukuda, Kyoto (JP); Toshio Tsuda, Osaka (JP); Kazuhiro Nobori, Osaka (JP); Seiichi Nakatani, Osaka (JP)

(73) Assignee: Panasonic Corporation, Osaka (JP)

( * ) Notice: Subject to any disclaimer, the term of this patent is extended or adjusted under 35 U.S.C. 154(b) by 357 days.

(21) Appl. No.: 11/405,478

(22) Filed: Apr. 18, 2006

(65) Prior Publication Data

US 2006/0231939 A1  Oct. 19, 2006

(30) Foreign Application Priority Data

Apr. 19, 2005  (JP) ............... 2005-121484

(51) Int. Cl.
*H01L 23/02* (2006.01)
(52) U.S. Cl. .............. 257/686; 257/777; 438/107
(58) Field of Classification Search ........ 257/686, 257/777, 723, 724; 438/107, 109, 110
See application file for complete search history.

(56) References Cited

U.S. PATENT DOCUMENTS

| | | | |
|---|---|---|---|
| 6,313,522 B1* | 11/2001 | Akram et al. | 257/686 |
| 6,472,735 B2* | 10/2002 | Isaak | 257/686 |
| 6,492,718 B2* | 12/2002 | Ohmori | 257/686 |
| 6,501,165 B1* | 12/2002 | Farnworth et al. | 257/686 |
| 6,897,552 B2* | 5/2005 | Nakao | 257/686 |
| 6,908,785 B2 | 6/2005 | Kim | |
| 2001/0054758 A1* | 12/2001 | Isaak | 257/686 |
| 2003/0111722 A1* | 6/2003 | Nakao | 257/686 |
| 2003/0168254 A1 | 9/2003 | Kariya et al. | |
| 2004/0238935 A1* | 12/2004 | Yoshimura | 257/686 |
| 2005/0184377 A1* | 8/2005 | Takeuchi et al. | 257/686 |
| 2006/0231939 A1* | 10/2006 | Kawabata et al. | 257/686 |
| 2007/0057358 A1* | 3/2007 | Satou et al. | 257/686 |

FOREIGN PATENT DOCUMENTS

| | | |
|---|---|---|
| JP | 2001-68617 | 3/2001 |
| JP | 2001-267490 | 9/2001 |

(Continued)

OTHER PUBLICATIONS

Korean Office Action, issued in Corresponding Korean Patent Application No. 10-2006-0031821, dated on Jun. 18, 2007.

(Continued)

*Primary Examiner*—S. V Clark
(74) *Attorney, Agent, or Firm*—McDermott Will & Emery LLP

(57) ABSTRACT

A semiconductor module is formed by alternately stacking resin boards and sheet members. Each of the resin boards includes first buried conductors. A semiconductor chip is mounted on the upper face of each of the resin boards. Each of the sheet members having an opening for accommodating the semiconductor chip and including second buried conductors electrically connected to the first buried conductors. A first resin board located at the bottom is thicker than second resin boards. Each of the sheet members includes an adhesive member covering the upper and side faces of the semiconductor chip.

21 Claims, 22 Drawing Sheets

FOREIGN PATENT DOCUMENTS

| | | |
|---|---|---|
| JP | 2002-064179 | 2/2002 |
| JP | 2003-021827 | 1/2003 |
| KR | 20030046791 | 6/2003 |
| WO | WO 03/067656 A1 | 8/2003 |

OTHER PUBLICATIONS

Japanese Office Action, with English translation, issued in Japanese Patent Application No. JP 2005-121484, mailed Nov. 13, 2007.
Chinese Office Action, with English translation, issued in Chinese Patent Application No. CN 200610073600.6, mailed Jul. 18, 2008.

* cited by examiner

FIG. 13A
FIG. 13B
FIG. 13C
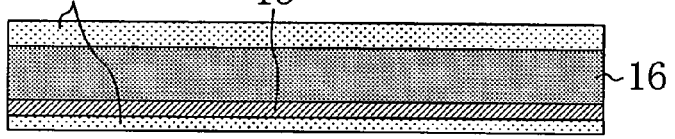
FIG. 13D
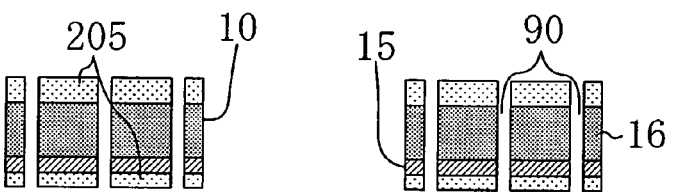
FIG. 13E
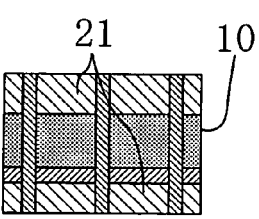 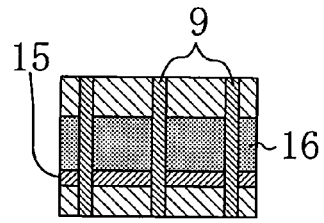
FIG. 13F
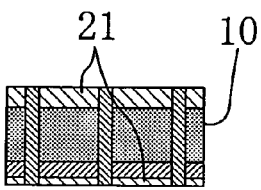 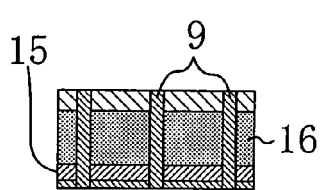
FIG. 13G
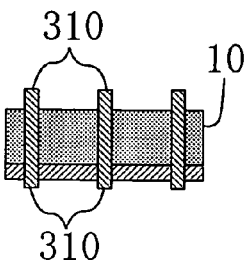 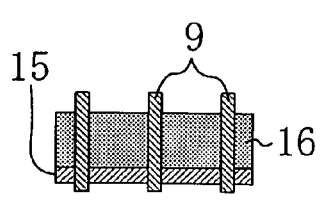

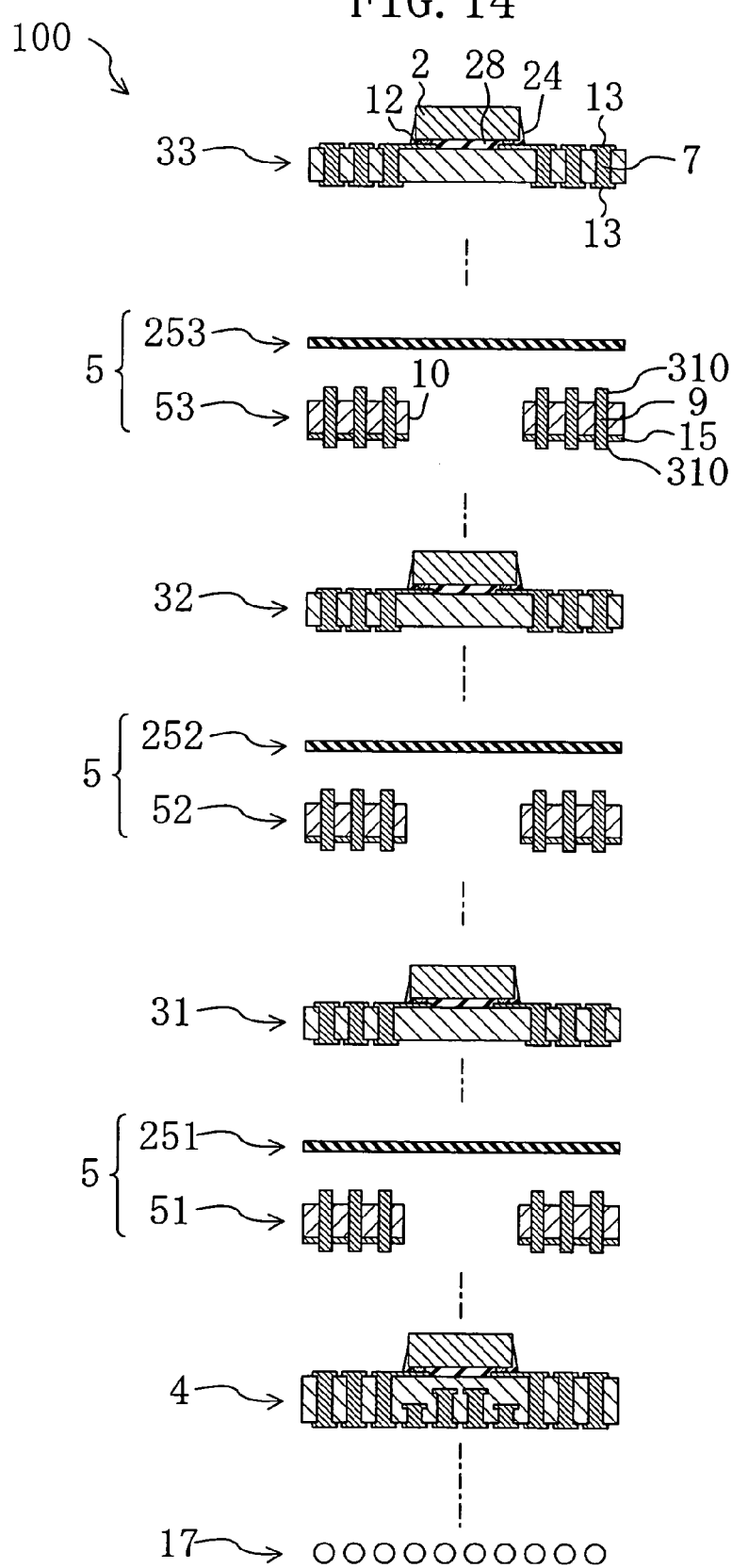

MULTILEVEL SEMICONDUCTOR MODULE AND METHOD FOR FABRICATING THE SAME

FIELD OF THE INVENTION

The present invention relates to three-dimensional multilevel semiconductor modules formed by alternately stacking sheet members and resin boards on which semiconductor chips are mounted and also relates to methods for fabricating the modules.

DESCRIPTION OF THE RELATED ART

With demands for size reduction and performance improvement of various electronic devices such as cellular phones and digital cameras, multilevel semiconductor modules formed by stacking and uniting a plurality of electronic components, especially semiconductor chips, have been proposed.

Methods for easily manufacturing such multilevel semiconductor modules at low cost have been proposed to date.

A conventional semiconductor module is formed by stacking, as one unit, a printed board on which a given circuit is formed, a semiconductor chip mounted on the printed board, and an interlayer member that has an opening capable of accommodating the semiconductor chip and includes a conductive bump capable of being connected to the circuit on the printed board. Such a conventional semiconductor module is fabricated by a method including the steps of: attaching protective films to both faces of an insulating base serving as an interlayer member; forming a through hole at a given position of the insulating base; filling the through hole with a conductive paste so as to form a conductive bump; peeling off the protective films; forming, in the insulating base, an opening capable of accommodating a semiconductor chip; and alternately stacking and bonding insulating bases and printed boards (see, for example, Japanese Unexamined Patent Publication No. 2002-64179).

With this method, a through hole is formed at a given position in an insulating base to both faces of which protective films are attached, the through hole is filled with a conductive paste, and then the protective films are peeled off, thereby forming conductive bumps protruding from the faces of the insulating base. Since the through hole penetrating the insulating base is filled with the conductive paste with this method, generation of a gap in a hole during the filling is avoided and connection reliability is enhanced, as compared to the case of using a via hole whose one open side is closed. In addition, electroplating that requires time and labor is unnecessary. Accordingly, a semiconductor module is easily fabricated at low cost.

Further, with miniaturization of electronic equipment such as IC cards and cellular phones, the density of semiconductor modules needs to be further increased and the thickness thereof needs to be further reduced. For this purpose, a semiconductor module having a stacked structure in which circuit boards on which semiconductor chips are mounted and interlayer members are alternately stacked and then are compressed with application of heat has been proposed (e.g., Japanese Unexamined Patent Publication No. 2003-218273). Specifically, circuit boards on which semiconductor chips have been mounted beforehand and interlayer members having openings capable of accommodating the semiconductor chips are alternately stacked with adhesive layers interposed therebetween, and then this stacked structure is compressed with application of heat. In this manner, the semiconductor chips are buried in the openings of the interlayer members so that electrical connection is established between the semiconductor chips through conductive posts formed on the interlayer members. With this method, the distance between the semiconductor chips is reduced, and failures caused by wiring resistance and inductance are reduced. As a result, electric signals are transmitted without delay and the density and function of the printed board are enhanced and the thickness thereof is reduced.

SUMMARY OF THE INVENTION

In recent years, techniques for reducing the thickness of semiconductor chips by polishing and techniques for mounting the thin semiconductor chips on boards with high yields have been developed, so that the number of levels of such stacked semiconductor chips has been further increasing. In addition, in a semiconductor memory, for example, as the memory capacity increases, the chip area increases. If a module is formed by stacking large semiconductor chips in multiple levels, the problem of a warp of the module arises. As the thickness of a printed board decreases, the degree of warp of the module increases. Accordingly, to stack printed boards on which semiconductor chips are mounted and interlayer members in multiple levels, it is important to suppress the occurrence of a warp.

On the other hand, to reduce the size and thickness of electronic devices, semiconductor chips and semiconductor modules are often packaged by, for example, a ball grid array (BGA) method in recent years. With such a packaging method, solder balls and bump electrodes formed to establish connection to a mother board cannot be so high. Accordingly, if a warp occurs at room temperature or is caused by heating during bonding, a semiconductor module cannot be mounted on the mother board or the warp causes a partial failure in packaging. That is, a semiconductor module can be defective in packaging though it is non-defective in its electric characteristics. A module formed principally of memories, a combination of a DRAM and an SRAM and a combination of a DRAM and a flash memory, for example, needs to be embedded and controlling semiconductor chips for controlling these memories also need to be mounted. Accordingly, it is required to suppress a warp occurring when semiconductor chips having different thicknesses and characteristics are stacked.

In addition, though size reduction and thickness reduction are required in a module because of its purpose, moisture resistance reliability as high as that in other types of semiconductor devices is also required. However, considering the structure formed by stacking circuit boards on which semiconductor chips are mounted, it is difficult to obtain high moisture resistance reliability enough to stand rigorous conditions, as compared to general semiconductor devices.

To solve the foregoing problems, the methods described above only provide structures in which boards on which semiconductor chips of the same shape are respectively mounted and include processes for forming the structures. However, no measures are taken to suppress a warp of a semiconductor module formed by stacking the boards and to enhance moisture resistance reliability of the semiconductor module.

It is therefore an object of the present invention to provide a multilevel semiconductor module in which occurrence of a warp is suppressed and a method for fabricating the module.

To solve the foregoing problems, a multilevel semiconductor module according to the present invention is formed by alternately stacking resin boards and sheet members. Each of the resin boards includes a first resin base and one or more first buried conductors penetrating the first resin base. A semiconductor chip is mounted on an upper face of each of the resin boards. Each of the sheet members includes a second resin base having an opening for accommodating the semiconductor chip and one or more second buried conductors penetrating the second resin base and electrically connected to the first buried conductors. The multilevel semiconductor module includes an adhesive member covering upper and side faces of the semiconductor chip. One of the resin boards located at the bottom has a thickness larger than that of each of the other resin board or boards. The upper and side faces of the semiconductor chip may be covered with either the adhesive member or a low-stress member which is softened at a temperature lower than that for the adhesive member and has a stiffness lower than that of the adhesive member.

In the multilevel semiconductor module of the present invention, the resin board at the bottom is thicker than the other resin boards, thereby suppressing occurrence of a warp of the entire multilevel semiconductor module. In addition, the exposed part of the semiconductor chip is covered with the adhesive member or a resin material having a low softening point and a low stiffness, so that water, moisture and corrosive gas, for example, causing corrosion of a wire material used for the semiconductor chips and the resin boards are blocked, thereby preventing occurrence of failures due to disconnection of wires.

A portion of the adhesive member located above the opening preferably has a thickness larger than the other portion. Then, the semiconductor chip is more securely covered and the number of components is reduced. The multilevel semiconductor module of this embodiment can be modified in various manners. For example, the diameter of some of the first and second buried members may be increased or a rigid plate may be attached to the module. In a structure in which the semiconductor chip is mounted with the back surface thereof facing the resin board, the semiconductor chip may be encapsulated with a resin.

A first method for fabricating a multilevel semiconductor module according to the present invention includes the steps of: (a) preparing one or more first resin boards, a second resin board and one or more sheet members, each of the first resin boards having an upper face on which a semiconductor chip is mounted and including one or more first buried conductors, the second resin board having an upper face on which a semiconductor chip is mounted, including one or more first buried conductors and having a thickness larger than that of each of the first resin boards, each of the sheet members including a resin base having an opening larger than the semiconductor chip when viewed from above, an adhesive member placed on at least one of upper and lower faces of the resin base and one or more second buried conductors penetrating the resin base; (b) placing the second resin board at the bottom and alternately stacking the sheet members and the first resin boards over the second resin board so that the semiconductor chip is housed in the opening; and (c) applying heat and pressure to the first and second resin boards and the sheet members stacked at the step (b) from the bottom and the top of the stacked structure so as to bond the first and second resin boards and the sheet members together, connect the first buried conductors and the second buried conductors to each other, and cause the adhesive member to flow so that the semiconductor chip is covered with the adhesive member.

With the method of the present invention, heat and pressure are applied with the adhesive member placed on at least one of the upper and lower faces of the second resin base at the step (b), so that an exposed part of the semiconductor chip is covered without an increase in the number of process steps, as compared to conventional methods. Accordingly, the present invention provides a multilevel semiconductor module having high resistance to entering of moisture, for example.

A second method for fabricating a multilevel semiconductor module according to the present invention includes the steps of: (a) preparing one or more first resin boards, a second resin board, one or more sheet members and one or more low-stress members, each of the first resin boards having an upper face on which a semiconductor chip is mounted and including one or more first buried conductors, the second resin board having an upper face on which a semiconductor chip is mounted, including one or more first buried conductors and having a thickness larger than that of each of the first resin boards, each of the sheet members including a resin base having an opening larger than the semiconductor chip when viewed from above, adhesive layers placed on upper and lower faces of the resin base in respective regions surrounding the opening when viewed from above and one or more second buried conductors penetrating the resin base, each of the low-stress members being made of a resin having a softening point lower than that of each of the adhesive layers and a stiffness lower than that of each of the adhesive layers, each of the low-stress members being smaller than the opening when viewed from above; (b) placing the second resin board at the bottom, alternately stacking the sheet members and the first resin boards over the second resin board so that the semiconductor chip is housed in the opening, and placing the low-stress members on associated ones of the semiconductor chips; and (c) applying heat and pressure to the first and second resin boards and the sheet members stacked at the step (b) from the bottom and the top to cause the low-stress members to flow so that the semiconductor chips are covered with the respective low-stress members, and (d) heating the first and second resin boards and the sheet members stacked at the step (b) from the bottom and the top to a temperature higher than a temperature at the step (c) with application of pressure, thereby bonding the first and second resin boards and the sheet members together and connecting the first buried conductors and the second buried conductors to each other.

With this method, the upper and side faces of the semiconductor chip are covered at the step (c) before the step (d) at which the components are united, thus ensuring covering of the semiconductor chip.

In the multilevel semiconductor module of the present invention, the resin board located at the bottom and connected to the external boards out of the stacked resin boards is thicker than the other boards, so that occurrence of a warp of the entire semiconductor module is suppressed. Accordingly, even if the number of terminals is increased, the module is coupled to a mother board with high reliability and functional enhancement and cost reduction of electronic equipment are effectively achieved. In addition, since the exposed parts of the semiconductor chips are covered with, for example, the adhesive members, moisture and corrosive gas, for example, are prevented from entering. Accordingly, failures are less likely to occur as compared to a conventional semiconductor module.

BRIEF DESCRIPTION OF THE DRAWINGS

FIGS. 13A through 13G are cross-sectional views illustrating a method for forming a sheet member for use in the semiconductor module of the second embodiment.

FIG. 14 is a view showing the semiconductor module of the second embodiment illustrated in FIGS. 11 and 12 in a disassembled state.

DETAILED DESCRIPTION OF THE INVENTION

Embodiment 1

Configuration of Semiconductor Module

Figure 1:
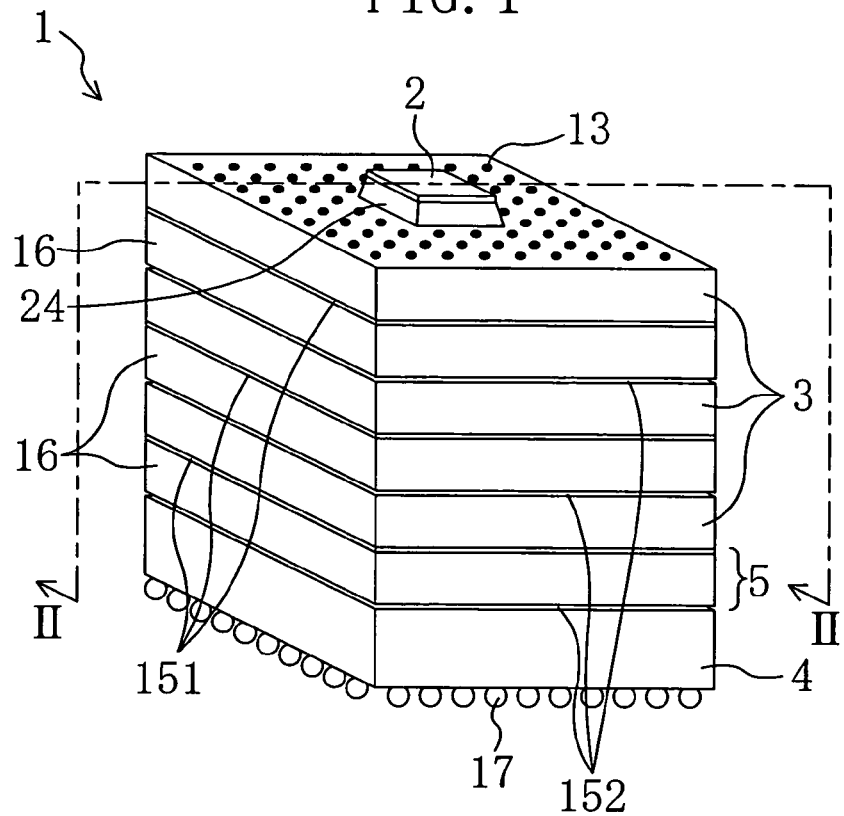
FIG. 1 is a perspective view schematically illustrating an overall configuration of a multilevel semiconductor module according to a first embodiment of the present invention.
Figure 2:
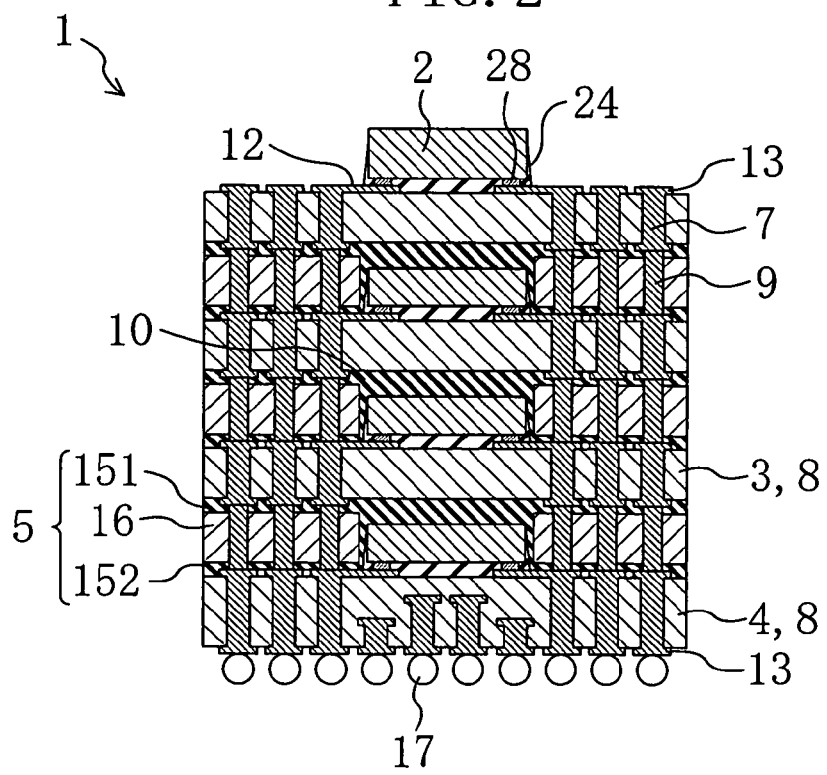
FIG. 2 is a cross-sectional view of the semiconductor module of the first embodiment taken along the line II-II in FIG. 1.
Figure 3A:
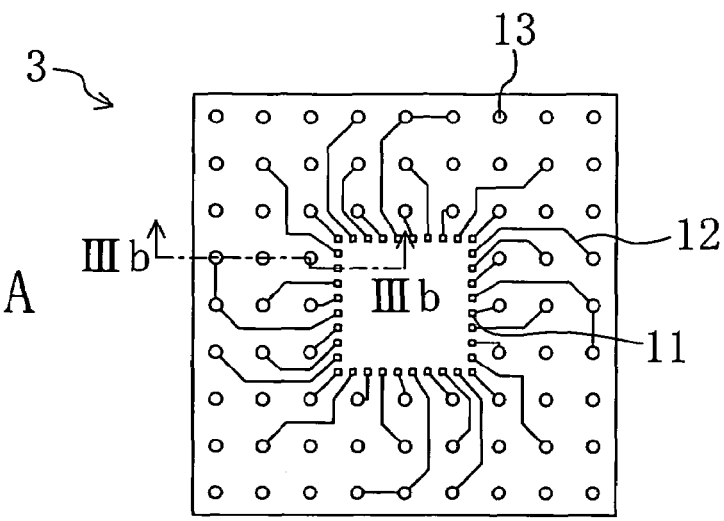
FIG. 3A is a plan view schematically illustrating the upper face of a resin board used in the semiconductor module of the first embodiment.
Figure 3B:
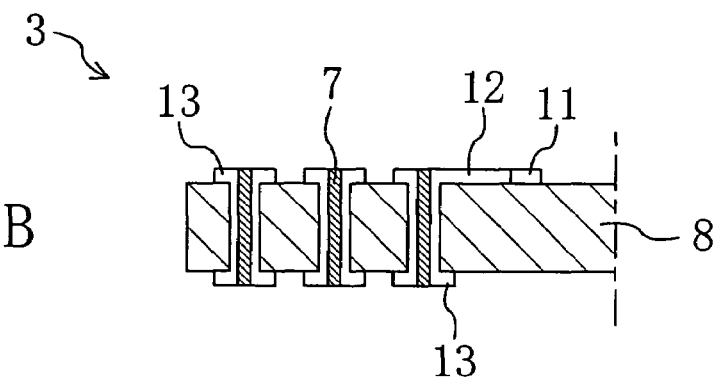
FIG. 3B is a cross-sectional view of the resin board of the first embodiment taken along the line IIIb-IIIb in FIG. 3A.
Figure 3C:
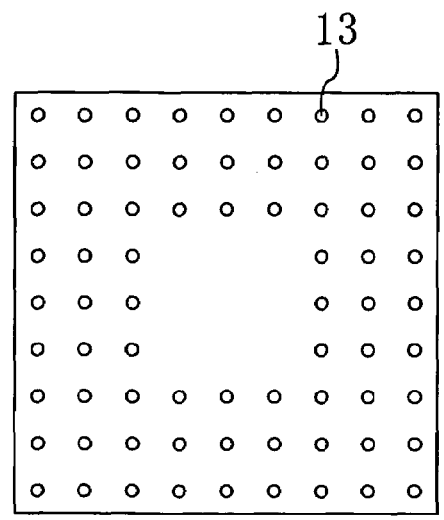
FIG. 3C is a plan view schematically illustrating the lower face of the resin board of the first embodiment.
Figure 4A:
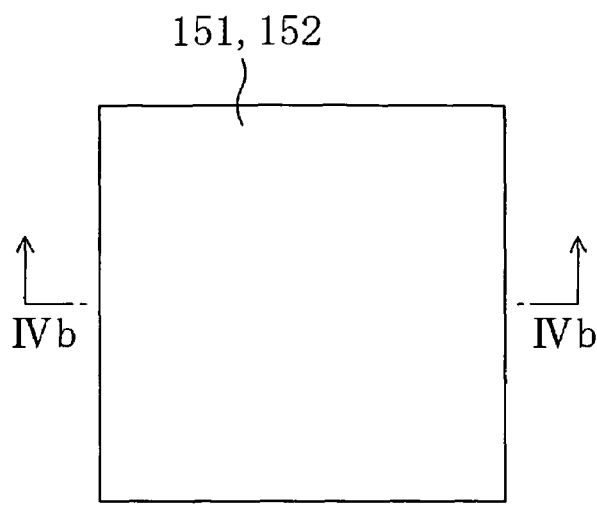
FIGS. 4A and 4B are a plan view illustrating an example of an adhesive member included in a sheet member used in the semiconductor module of the first embodiment and a cross-sectional view illustrating the adhesive member taken along the line IVb-IVb, respectively.
Figure 4B:
Figure 4C:
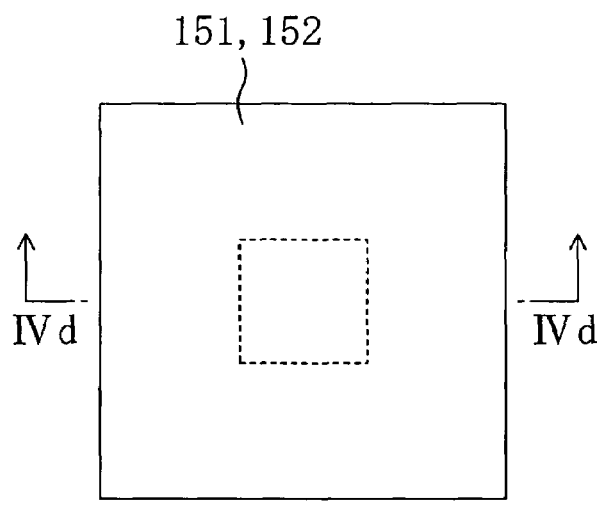
FIGS. 4C and 4D are a plan view illustrating another example of the adhesive member of the first embodiment and a cross-sectional view illustrating the adhesive member taken along the line IVd-IVd, respectively.
Figure 4D:
Figure 5A:
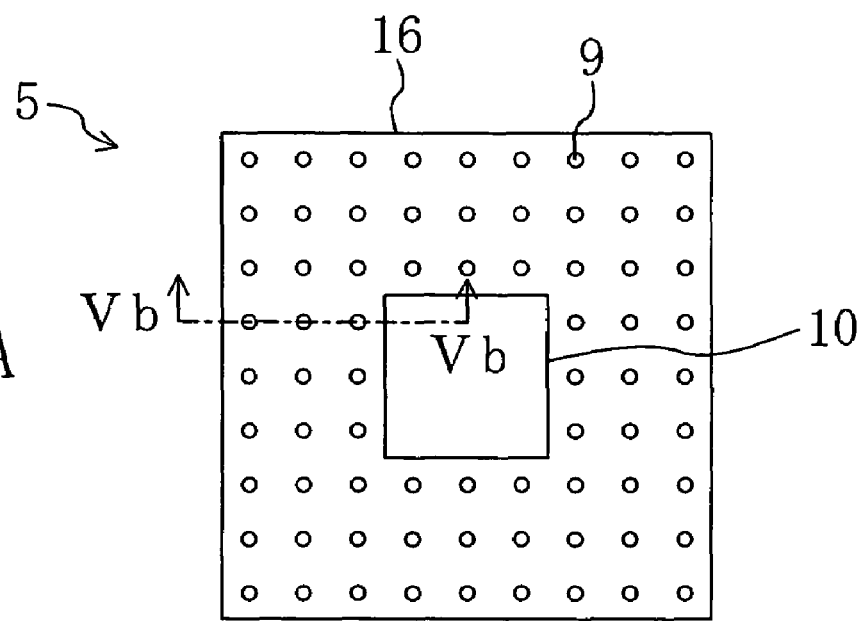
FIGS. 5A and 5B are a plan view illustrating a second resin base included in the sheet member of the first embodiment and a cross-sectional view illustrating the second adhesive member taken along the line Vb-Vb, respectively.
Figure 5B:
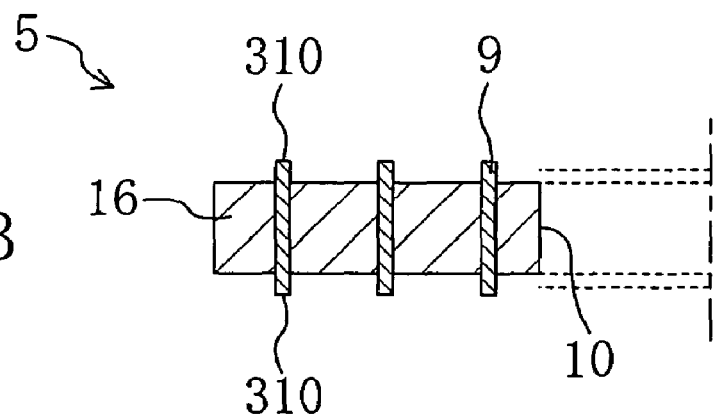

FIG. 1 is a perspective view schematically illustrating an overall configuration of a multilevel semiconductor module according to a first embodiment of the present invention. FIG. 2 is a cross-sectional view of the multilevel semiconductor module of this embodiment taken along the line II-II in FIG. 1. FIG. 3A is a plan view schematically illustrating the upper face of a resin board used in the multilevel semiconductor module of this embodiment. FIG. 3B is a cross-sectional view of the resin board of this embodiment taken along the line IIIb-IIIb in FIG. 3A. FIG. 3C is a plan view schematically illustrating the lower face of the resin board of this embodiment. FIGS. 4A and 4B are a plan view illustrating an example of an adhesive member included in a sheet member used in the multilevel semiconductor module of this embodiment and a cross-sectional view illustrating an adhesive member taken along the line IVb-IVb, respectively. FIGS. 4C and 4D are a plan view illustrating another example of the adhesive member of this embodiment and a cross-sectional view illustrating the adhesive member taken along the line IVd-IVd, respectively. FIGS. 5A and 5B are a plan view illustrating a second resin base included in the sheet member of this embodiment and a cross-sectional view illustrating the second resin base taken along the line Vb-Vb, respectively. In these drawings, the thicknesses and lengths, for example, of components of the semiconductor module are selected so as to be easily shown, and therefore are different from those of actual components. The numbers and shapes of buried conductors and external connection terminals for external connection are different from those of actual conductors and terminals are selected to be easily shown in the drawings. The "upper face" and the "lower face" of each component are defined based on the vertical direction in FIGS. 1 and 2.

As illustrated in FIGS. 1 and 2, a semiconductor module 1 of this embodiment is formed by alternately stacking first resin boards 3 having upper faces on which semiconductor chips 2 are mounted and sheet members 5. In the semiconductor module 1, the resin board located at the bottom (i.e., a second resin board 4) is thicker than the other resin boards and solder balls 17 serving as external connection terminals are provided on the lower face of the second resin board 4. In the semiconductor module 1, the first resin boards 3, the second resin board 4 and the sheet members 5 are stacked and united by application of heat and pressure. In the example of this embodiment, the first resin boards 3 are stacked together with the sheet members 5 in the semiconductor module 1. In the semiconductor module 1 of this embodiment, the upper faces (the back surfaces, i.e., the faces opposite to the principal surfaces) and the side faces of the respective semiconductor chips 2 are covered with first adhesive members 151 and second adhesive members 152 forming the sheet members 5.

The configuration of the semiconductor module of this embodiment will be more specifically described.

As illustrated in FIGS. 3A through 3C, each of the first resin boards 3 includes: a first resin base (a first resin core) 8; a plurality of semiconductor-device connecting terminals 11 formed on a center region of the upper face of the first resin base 8, for example, and used for establishing connection to a semiconductor chip 2; a plurality of first buried conductors 7 formed in an area of the first resin base 8 around the perimeter thereof and penetrating the first resin base 8; a plurality of connection lands 13 provided on both faces of the first resin base 8 and around both ends of the respective first buried conductors 7; and a plurality of wires 12 connecting predetermined ones of the semiconductor-device connecting terminals 11 to associated ones of the connection lands 13 and the first buried conductors 7.

As a material for the first buried conductors 7, a conductive resin material or a plated conductor is used. A base made of a thermosetting resin and a reinforcing material may be used as the first resin base (first resin core) 8. As the thermosetting resin, at least one material selected from the group consisting of an epoxy resin, a polyimide resin, a polyphenylene ether resin, a phenol resin, a fluorocarbon resin and an isocyanate resin may be used. As the reinforcing material, a woven or nonwoven fabric made of glass fibers or a woven or nonwoven fabric made of aramid fibers, which are organic fibers, may be used.

The second resin board 4 has a structure similar to that of the first resin boards 3 as a whole, and includes: a first resin base 8; semiconductor-device connecting terminals 11; first buried conductors 7; and connection lands 13. However, the second resin board 4 is thicker than each of the first resin boards 3 and has a structure in which solder balls 17 are formed on the connection lands 13, serving as external connection terminals for connection to a mother board, at given intervals on the lower face of the board. The semiconductor module 1 is coupled to the mother board using the solder balls 17.

The semiconductor chips 2 are connected to the semiconductor-device connecting terminals 11 of the first resin boards 3 and the second resin board 4 through electrode bumps 28 provided on the principal surfaces thereof, and the peripheries of the semiconductor chips 2 are protected by a sealing resin 24. The sealing resin 24 protects the principal surfaces (i.e., the lower faces in FIG. 1) of the semiconductor chips 2 against external environment and absorbs thermal distortion, for example. The "principal surface of a semiconductor chip" herein is a circuitry surface on which semiconductor devices, for example, are formed.

As illustrated in FIGS. 4A through 4D and FIGS. 5A and 5B, each of the sheet members 5 includes: a second resin base (a second resin core) 16; a first adhesive member 151 formed on the upper face of the second resin base 16; a second adhesive member 152 formed on the lower face of the second resin base 16; and second buried conductors 9 provided at positions corresponding to the first buried conductors 7 of the first resin board 3 and made of a conductive resin material. An opening 10 capable of accommodating the semiconductor chip 2 is formed in a center region of the second resin base 16. Accordingly, the planar size of the opening 10 is larger than that of the semiconductor chip 2. Each of the first and second adhesive members 151 and 152 may be in the shape of a sheet having a uniform thickness as illustrated in FIGS. 4A and 4B. Alternatively, as illustrated in FIGS. 4C and 4D, a center portion of the first adhesive member 151 is thicker than the other portion and the second adhesive member 152 is in the shape of a sheet having a uniform thickness. This further ensures covering of the side face and upper face (i.e., the face opposite to the principal surface) of the semiconductor chip 2 during application of pressure and heat in stacking the sheet members 5 and the resin boards. In this case, the first adhesive member 151 is greatly deformed along the semiconductor chip 2 during application of heat and pressure. In view of this, the first adhesive member 151 is preferably in the shape of a sheet with a uniform thickness. It should be noted that the shapes of the first and second adhesive members 151 and 152 are not limited to this. A portion of the first adhesive member 151 not overlapping with the opening 10 when viewed from above bonds the second resin base 16 and the first resin base 8 together. A portion of the second adhesive member 152 not overlapping with the opening 10 when viewed from above connects either the second resin base 16 and the first resin base 8 forming the second resin board 4 or the second resin base 16 and the first resin base 8 forming the first resin board 3 to each other.

The semiconductor module 1 is characterized in that portions of the respective first and second adhesive members 151 and 152 overlapping with the opening 10 when viewed from above are fused together to cover the side face and upper face (i.e., the face opposite to the principal surface) of the semiconductor chip 2.

The semiconductor chips 2 mounted on the upper faces of the first resin boards 3 and the second resin board 4 are placed in the respective openings 10 of the second resin bases 16 in the semiconductor module 1. In each of the openings 10, a gap between the semiconductor chip 2 and the second resin base 16 and a gap between the semiconductor chip 2 and the first resin board 3 located above are filled with the first adhesive member 151 and the second adhesive member 152. As specifically described later, such a structure is formed by applying heat and pressure to the stack of the first resin boards 3, the second resin board 4 and the sheet members 5. Specifically, the openings 10 are filled with the first and second adhesive members 151 and 152 in the state of fluid due to heating.

The first and second adhesive members 151 and 152 may be made of a prepreg base obtained by impregnating a reinforcing material made of a glass woven fabric or an aramid nonwoven fabric with an epoxy resin or a thermoplastic resin that is dissolved and softened by applying pressure and heat. The thermoplastic resin may be an organic film, for example, and is exemplified by wholly aromatic polyester, a fluorocarbon resin, a polyphenylene oxide resin, a syndiotactic polystyrene resin, a polyimide resin, a polyamide resin, an aramid resin and a polyphenylene sulfide resin.

As illustrated in FIG. 5B, the second buried conductors 9 penetrate the second resin base 16 and having both ends project from the upper and lower faces of the second resin base 16 to a given height. The parts of the second buried conductors 9 projecting from the second resin base 16 are shown as projections 310.

The second buried conductors 9 are semi-cured before stacking. The second buried conductors 9 are compressed and cured by application of pressure and heat after stacking, and establish electrical connection to the first buried conductors 7 in the first resin boards 3 and the second resin board 4 mainly by mechanical contact.

In the semiconductor module 1 of this embodiment, vias formed in the first resin boards 3 and the second resin board 4 are filled with the first buried conductors 7. Alternatively, both of the first resin boards 3 and the second resin board 4 may be general build-up printed wiring boards. In this case, vias in the build-up printed wiring boards are formed by plating in the shape of recesses, so that the effect of joining the vias and the projections 310 of the second buried conductors 9 in the sheet members 5 together enhances reliability in obtaining electrical connection and alignment is easily performed.

The second resin bases 16 forming the sheet members 5 may be made of the same material as that for the first resin boards 3 and the second resin board 4, i.e., may be made of a glass-epoxy resin or an aramid-epoxy resin, for example. Alternatively, the first resin boards 3 and the second resin board 4 may be made of different materials. For example, a glass-epoxy resin may be used for the first resin boards 3 and the second resin board 4 and an aramid-epoxy resin may be used for the sheet members 5. The outer dimensions of the sheet members 5 are the same as those of the first resin boards 3 and the second resin board 4 in plan view. To bond the stack of the second resin bases 16 forming the sheet members 5 and the first resin boards 3 or the second resin board 4 together, the first and second adhesive members 151 and 152 made of a prepreg of an epoxy resin or an aramid-epoxy resin may be used. The outer dimensions thereof are the same as those of the resin boards in plan view.

An example of the shapes of main portions of components in the multilevel semiconductor module 1 of this embodiment will be hereinafter described.

The entire shape of the semiconductor module is, for example, a rectangular solid. The thickness of each of the semiconductor chips is preferably in the range from 30 µm to 150 µm, both inclusive. The thickness of each of the first resin boards 3 is in the range from 60 µm to 200 µm, both inclusive. Each of the first buried conductors 7 has a diameter ranging from 50 µm to 500 µm, both inclusive. The first buried conductors 7 are arranged at a pitch ranging from 100 µm to 750 µm, both inclusive. Using these ranges, the semiconductor module is appropriately designed.

The thickness of the second resin board 4 is in the range from 100 µm to 300 µm, both inclusive, and larger than that of at least each of the first resin boards 3. The diameter and pitch of the first buried conductors 7 in the second resin board 4 are the same as those in the first resin boards 3.

The thickness of each of the second resin bases 16 as a component of the sheet members 5 is in the range from 45 µm to 200 µm, both inclusive, and is larger than that of at least each of the semiconductor chips 2. An adhesive layer having a thickness ranging from 10 µm to 100 µm, both inclusive, is provided on each face of the second resin bases 16. The diameter and pitch of the second buried conductors 9 in each of the sheet members 5 are the same as those in the first resin boards 3.

Each of the first and second adhesive members 151 and 152 forming the sheet members 5 is a prepreg of a resin such as a glass-epoxy resin or an aramid epoxy resin and has a thickness ranging from 15 µm to 150 µm, both inclusive.

Based on the design using the ranges described above, the multilevel semiconductor module 1 of this embodiment is fabricated.

—Effects and Advantages of Semiconductor Module—

In the configuration of the multilevel semiconductor module 1 of this embodiment described above, the second resin board 4 at the bottom is thicker than each of the first resin boards 3, so that a warp is greatly suppressed even in the multilevel configuration. In addition, in the semiconductor module 1 of this embodiment, the side and upper faces of the semiconductor chips 2 are covered with the first and second adhesive members 151 and 152, so that water, moisture and corrosive gas, for example, causing corrosion of a wire material are less likely to enter the openings 10. Accordingly, occurrence of failures due to disconnection of wires is prevented. That is, moisture resistance of the semiconductor module 1 of this embodiment is higher than a conventional semiconductor module. Accordingly, failures are less likely to occur in mounting on a mother board using the solder balls 17. As a result, even if the number of terminals is increased, a highly-reliable semiconductor module is implemented at low cost.

A necessary electrical inspection and a necessary burn-in test are performed on the first resin boards 3 and the second resin board 4 after mounting of the semiconductor chips 2 so that only non-defective boards are used. During stacking of the resin boards and the sheet members 5, the second buried conductors 9 in the second resin bases 16 forming the sheet members 5 are compressed and cured with application of pressure and heat, so that electrical connection between the second buried conductors 9 and the first buried conductors 7 and the reduction of resistance of the second buried conductors 9 are achieved at the same time.

In addition, if the second resin bases 16 having a high stiffness and forming the sheet members 5 are made thicker than the semiconductor chips 2, loads applied to the semiconductor chips 2 are reduced during fabrication, thus preventing failures from occurring in the semiconductor chips 2 themselves and in connection portions between the semiconductor chips 2 and the resin boards.

Semiconductor devices formed on the semiconductor chips 2 are not specifically limited. A structure in which semiconductor memories are formed on the semiconductor chips 2 mounted on the first resin boards 3 whereas a control semiconductor device for controlling the semiconductor memories is formed on the semiconductor chip 2 mounted on the second resin board 4 may be adopted.

—Method for Fabricating Semiconductor Module—

Now, a method for fabricating a semiconductor module of this embodiment will be described with reference to the drawings.

First, a method for obtaining a semiconductor chip 2 having a given shape will be described.

Figure 6A:
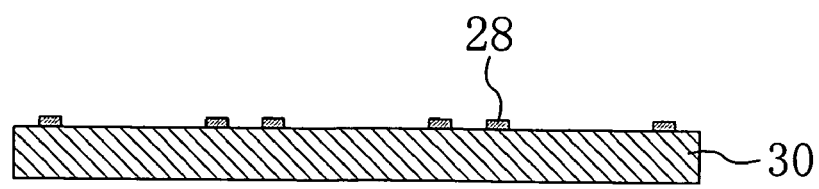
FIGS. 6A through 6C are cross-sectional views illustrating an example of a method for forming a semiconductor chip to be mounted in the semiconductor module of the first embodiment.
Figure 6B:
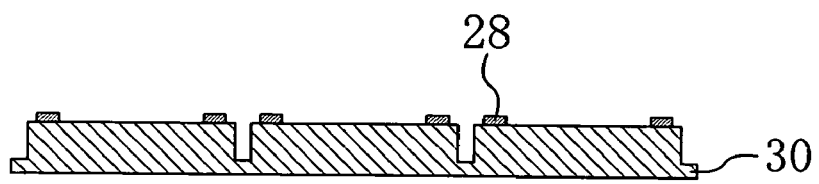
Figure 6C:
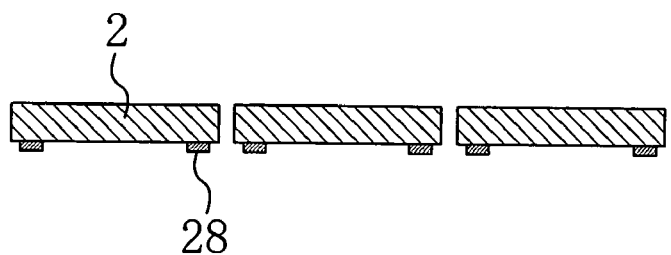

FIGS. 6A through 6C are cross-sectional views illustrating an example of a method for forming a semiconductor chip to be mounted on the semiconductor module 1 of this embodiment.

As illustrated in FIG. 6A, electrode bumps 28 are formed by, for example, electroplating or stud bump bonding (SBB)

on bonding pads on the principal surfaces of a plurality of semiconductor chips 2 in a semiconductor wafer 30 that has been subjected to a circuit formation process necessary for the semiconductor chips.

Then, as illustrated in FIG. 6B, the semiconductor wafer 30 is partially cut to the middle with a dicing saw or a laser from the principal surface along a separation zone located between the semiconductor chips 2.

Thereafter, as illustrated in FIG. 6C, a back-surface portion of the semiconductor wafer 30 is removed by a method such as chemical etching, back-surface polishing, plasma etching or a method using these techniques so that the thickness of the semiconductor wafer is reduced to a thickness ranging from about 30 μm to about 150 μm, both inclusive, thereby separating the semiconductor chips 2 from each other.

Next, an example of a method for fabricating the first resin boards 3 and the second resin board 4 for mounting the semiconductor chips 2 thereon will be described with reference to FIG. 7A through 7D. Hereinafter, description will be given on one of the first resin boards 3 as an example. In the following example, a glass-epoxy resin is used as the first resin base 8 forming each of the first resin board 3 and copper foil 19 is used as the wires 12 and the connection lands 13. FIGS. 7A through 7D are cross-sectional views showing a method for forming a resin board for use in the semiconductor module of this embodiment.

Figure 7A:
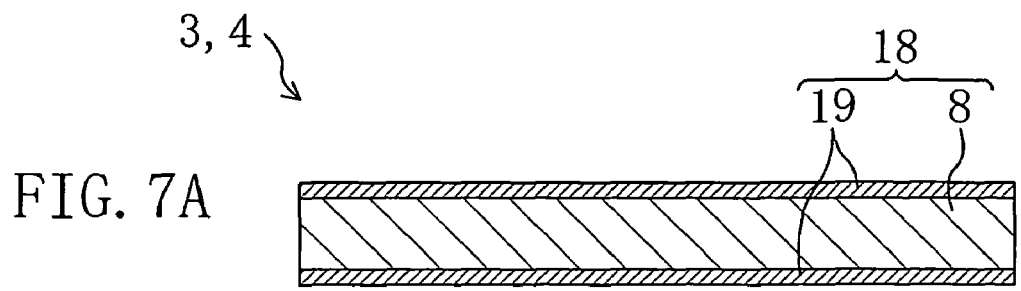
FIGS. 7A through 7D are cross-sectional views showing a method for forming a resin board for use in the semiconductor module of the first embodiment

As illustrated in FIG. 7A, a two-side copper-clad board 18 formed by covering both faces of the first resin base 8 with copper foil 19 is prepared. In the two-side copper-clad board 18, the copper foil 19 having a thickness of one of 9 μm, 12 μm, 24 μm and 35 μm is appropriately bonded to each face of the first resin base 8 having a thickness of 70 μm, so that the total thickness of the two-side copper-clad board 18 is about 100 μm.

Figure 7B:
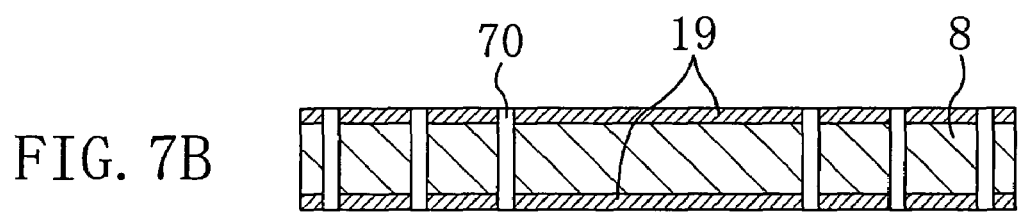

Then, as illustrated in FIG. 7B, the two-side copper-clad board 18 is irradiated with a laser focused on given positions, thereby forming through holes 70. The through holes 70 may be formed with a drill.

Figure 7C:
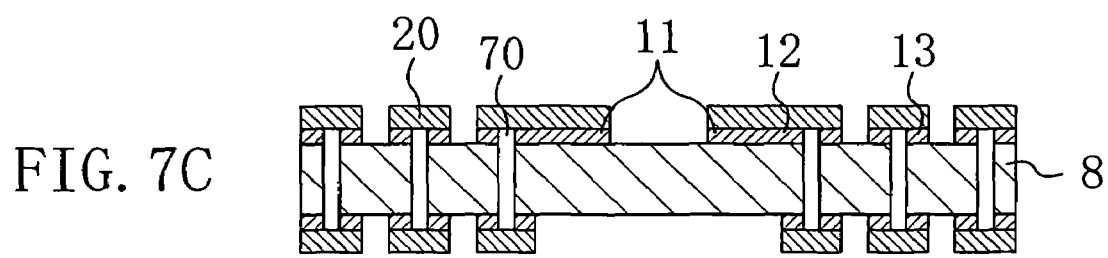

Subsequently, as shown in FIG. 7C, photosensitive films 20 are attached to both faces of the two-side copper-clad board 18 and semiconductor-device connecting terminals 11, connection lands 13 and wires 12 connecting the semiconductor-device connecting terminals 11 and the connection lands 13 to each other are formed on one face of the first resin base 8. Connection lands 13 are also formed on the other face of the first resin base 8. The pattern for these components is formed by photolithography and etching using the photosensitive films 20. Thereafter, the photosensitive films 20 are peeled off from the both faces of the two-side copper-clad board 18 (not shown).

Figure 7D:
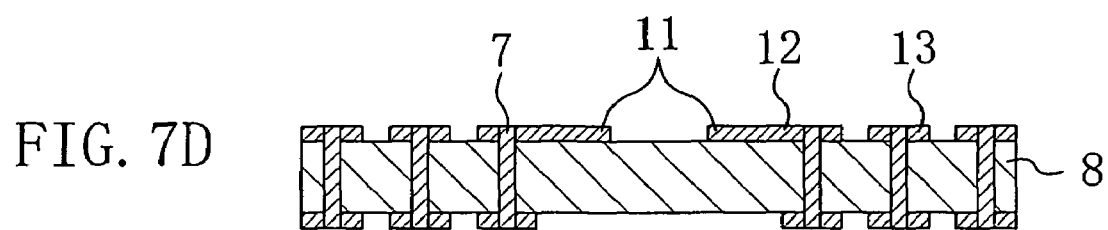

Thereafter, as illustrated in FIG. 7D, the through holes 70 are filled with, for example, a conductive paste. This conductive paste is cured with heat, thereby obtaining a first resin board 3 including first buried conductors 7. The first resin boards 3 and the second resin board 4 are not necessarily formed by the method described above and may be formed by a method for forming a general two-side circuit board and by using general materials.

Next, a method for forming a second resin base 16 forming a sheet member 5 will be described with reference to FIGS. 8A through 8F. FIGS. 8A through 8F are cross-sectional views showing a method for forming a sheet member for use in the semiconductor module of this embodiment.

Figure 8A:
FIGS. 8A through 8F are cross-sectional views showing a method for forming a sheet member for use in the semiconductor module of the first embodiment.

First, as shown in FIG. 8A, a second resin base 16 thicker than a semiconductor chips 2 is prepared. A glass fabric epoxy resin, for example, is used as the second resin base 16. If the thickness of the semiconductor chip 2 is 75 μm, the thickness of the second resin base 16 is about 100 μm.

Figure 8B:
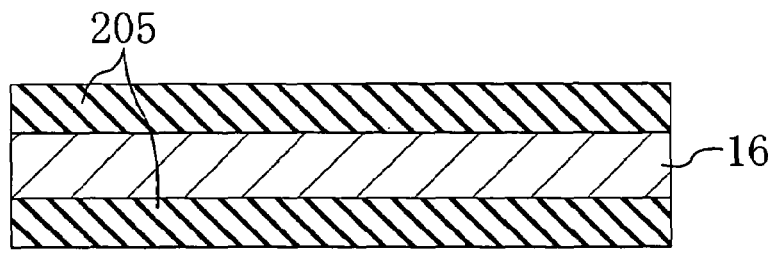

Next, as shown in FIG. 8B, heat-resistance protective films 205 made of polyimide or PET (polyethylene terephthalate) resin, for example, and each having a thickness of about 15 μm are formed on the upper and lower faces of the second resin base 16.

Figure 8C:
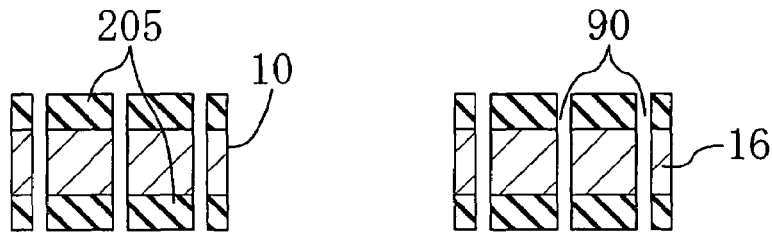

Thereafter, as illustrated in FIG. 8C, through holes 90 are formed in given portions of the second resin base 16 with a laser. Simultaneously with the formation of the through holes 90, an opening 10 capable of accommodating the semiconductor chip 2 is formed with the laser in a center region of the second resin base 16. Thereafter, the heat-resistance protective films 205 are peeled off from the upper and lower faces of the second resin base 16. FIG. 8C shows a process step up to the formation of the through holes 90 and the opening 10.

Figure 8D:
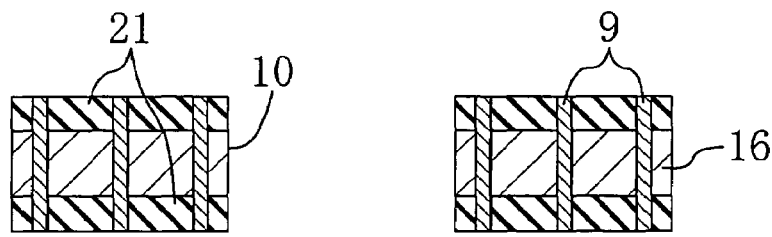

Then, as illustrated in FIG. 8D, masking films 21 having holes at positions corresponding to the through holes 90 in the second resin base 16 are attached to both faces of the second resin base 16, and then the through holes 90 are filled with a conductive paste by, for example, screen printing. The masking films 21 are used for forming projections 310 of the second buried conductors 9.

Figure 8E:
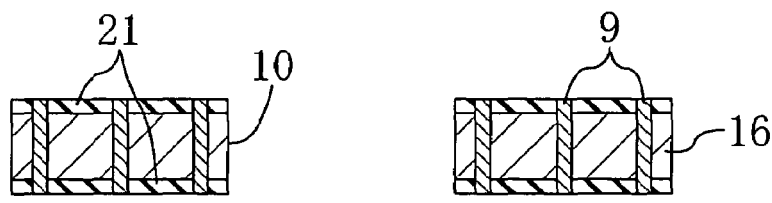

Subsequently, as illustrated in FIG. 8E, the conductive paste filling the through holes 90 and the holes in the masking films 21 is heated with application of pressure to be semi-cured, and the filling density of the conductive paste is increased. In this manner, the conductive paste becomes electrically low-resistive.

Figure 8F:
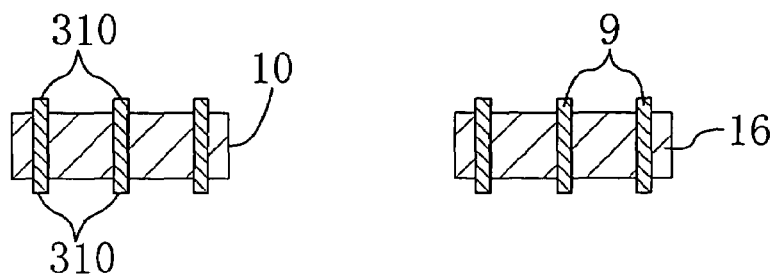

Then, as shown in FIG. 8F, the masking films 21 are peeled off, thereby forming a second resin base 16 forming a sheet member 5. The second buried conductors 9 made of the conductive paste are still semi-cured, so that the second buried conductors 9 have the property of being compressed and cured simultaneously upon application of pressure and heat.

Now, a method for forming a first adhesive member 151 for a sheet member 5 illustrated in FIGS. 4A and 4B will be described (not shown).

First, a liquid resin which is a main component of a thermosetting resin such as a glass-epoxy resin or an aramid-epoxy resin, a curing agent, an accelerator, an inorganic filler and a coupling agent, for example, are mixed in given amounts. Then, the mixture is sufficiently stirred with the temperature maintained in the range from 40° C. to 120° C., both inclusive. Thereafter, as an example, the mixture is poured between rollers between which a uniform gap of 20 μm is previously set with the temperature maintained in the range from 40° C. to 120° C., both inclusive. In this manner, the mixture is changed into a thin plate made of a cured resin and having a thickness of 20 μm between the rollers. Then, the resultant resin thin plate is cut into pieces of the sizes of the first resin boards 3, the second resin board 4 or the second resin bases 16 using a press, a laser or a cutter. It should be noted that the length and width of the cured resin thin plate may be integral multiples of those boards or bases if necessary. The mixture may contain no inorganic filler according to the purpose. In this manner, a first adhesive member 151 is formed.

Now, a method for forming a second adhesive member 152 for a sheet member 5 illustrated in FIGS. 4C and 4D will be described.

First, rollers between which the mixture described above is to pass are set to have a uniform gap of 40 μm and the mixture is poured between the rollers at a temperature lower than the range described above. In this manner, a thin plate of a semi-cured resin is obtained. Thereafter, a portion of the thin plate corresponding to an opening 10 of a second resin base 16 is pressed with a molding die which is used for forming a projection smaller than the opening, thereby forming a second adhesive member 152 whose center part is thicker than the other part as illustrated in FIGS. 4C and 4D. The molding die is kept at a temperature of 40° C. to 120° C., both inclusive.

With the foregoing methods, the first and second adhesive members 151 and 152 used in sheet members 5 are formed. During stacking of the resin boards, adhesive members each having a uniform thickness may be attached to both faces of the second resin base 16 or adhesive members whose center portions are thicker than the other portions thereof may also be attached to both faces of the second resin base 16.

Now, a process of mounting the semiconductor chips 2 on the first resin boards 3 and the second resin board 4 will be described.

In mounting the semiconductor chips 2 on the first resin boards 3 and the second resin board 4, the electrode bumps 28 of the semiconductor chips 2 are bonded to the semiconductor-device connecting terminals 11 of the first resin boards 3 and the second resin board 4 using, for example, solder or a conductive resin. Though not shown, the semiconductor chips 2 may be mounted in the following manner. First, the back surfaces of the semiconductor chips 2 face the respective resin boards and the semiconductor chips 2 and the semiconductor-device connecting terminals 11 are connected together by wire bonding. Then, a sealing resin 24 is applied onto the semiconductor chips 2 and then is cured to fill gaps formed after the bonding. In this manner, the first and second resin boards 3 and 4 on which the semiconductor chips 2 are mounted are obtained. Thereafter, an electrical inspection and a burn-in test are performed, so that the resultant semiconductor device is as reliable as a semiconductor device incorporated in a general package.

Figure 9:
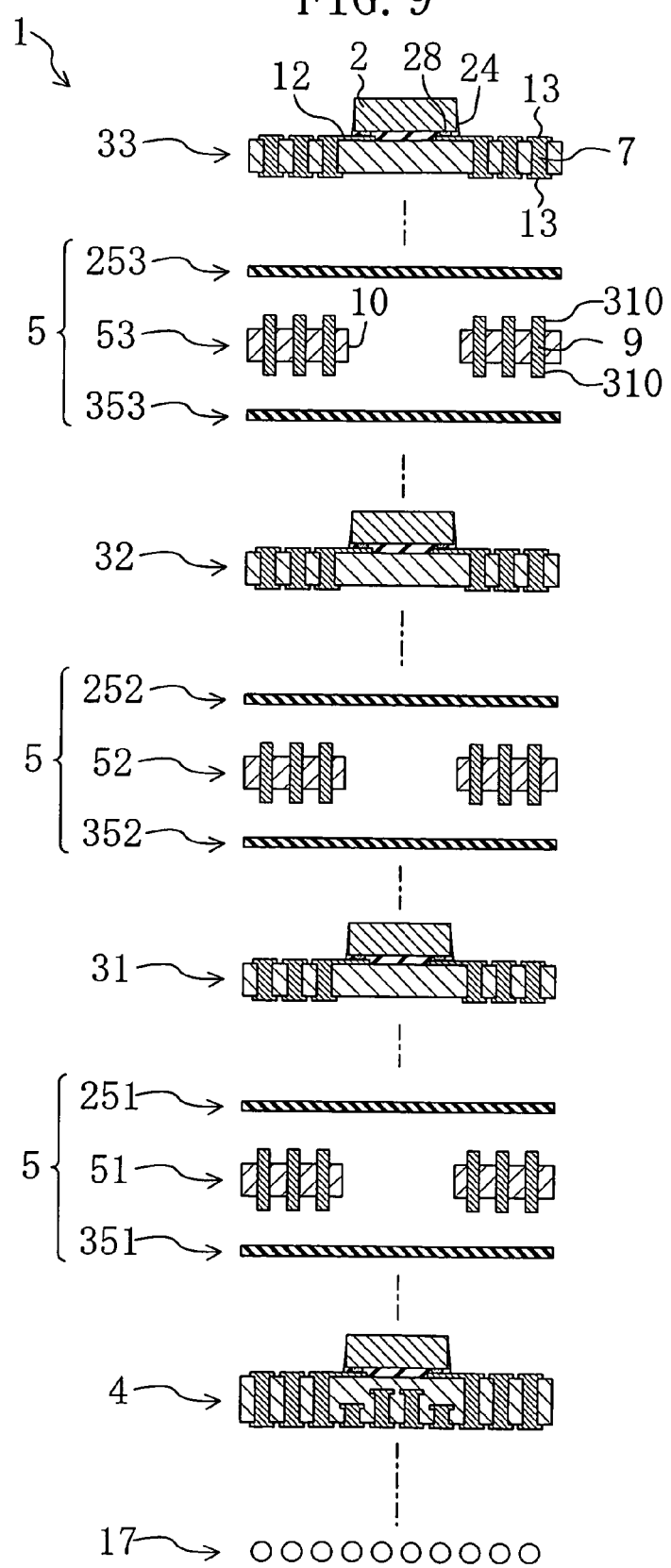
FIG. 9 is a view illustrating the semiconductor module of the first embodiment illustrated in FIG. 1 in a disassembled state.

Now, a process of stacking the first and second resin boards 3 and 4 on which the semiconductor chips 2 are mounted and the sheet members 5 and then uniting the stacked components will be described with reference to FIG. 9. FIG. 9 is a view illustrating the semiconductor module of the first embodiment illustrated in FIG. 1 in a disassembled state. In FIG. 9, to simplify description, the first resin boards 3 are individually referred to as a first-level first resin board 31, a second-level first resin board 32 and a third-level first resin board 33. Likewise, the second resin bases 16 forming the respective sheet members 5 are referred to as a first-level second resin base 51, a second-level second resin base 52 and a third-level second resin base 53. The first adhesive members 151 and the second adhesive members 152 are also referred to as a first-level first adhesive member 251, a second-level first adhesive member 252, a third-level first adhesive member 253, a first-level second adhesive member 351, a second-level second adhesive member 352 and a third-level second adhesive member 353.

As illustrated in FIG. 9, the second resin board 4 is placed at the bottom. Over the second resin board 4, the first-level second adhesive member 351, the first-level second resin base 51, the first-level first adhesive member 251 and the first-level first resin board 31 are placed in this order. Then, the second-level second adhesive member 352, the second-level second resin base 52, the second-level first adhesive member 252, the second-level first resin board 32, the third-level second adhesive member 353, the third-level second resin base 53, the third-level first adhesive member 253 and the third-level first resin board 33 are placed in this order.

These components are stacked in such a manner that the semiconductor chips 2 are mounted on the upper faces of the first resin boards 3 and the second resin board 4. The first resin boards 3 and the second resin board 4 are placed such that the semiconductor chips 2 are housed in the openings 10 of the second resin bases 16 forming the respective sheet members 5. The connection lands 13 of the first resin boards 3 and the second resin board 4 are accurately positioned with respect to the projections 310 of the second buried conductors 9 in the second resin bases 16 forming the sheet members 5.

Then, the resin boards and the sheet members are stacked in the manner described above and are made in close contact with each other. Thereafter, the stacked structure is subjected to application of heat and pressure in the atmosphere.

With this process, the adhesive members provided at the first through third levels are softened, thereby bonding the second resin board 4 and the first-level through third-level first resin boards 31 through 33 together. In addition, through application of pressure and heat, the second buried conductors 9 whose both ends are formed as the projections 310 penetrate the softened first and second adhesive members 151 and 152 on the upper and lower faces of the second resin bases 16. Accordingly, the second buried conductors 9 are brought into mechanical contact with the connection lands 13 provided on the second resin board 4, the first-level first resin board 31, the second-level first resin board 32 and the third-level first resin board 33 to establish electrical connection.

At the same time, the first and second adhesive members 151 and 152 flow to cover the side faces and upper faces (i.e., faces opposite to the respective principal surfaces) of the semiconductor chips 2 placed in the openings 10 of the second resin bases 16 and to fill the openings 10. Specifically, with application of pressure and heat, the first and second adhesive members 151 and 152 are softened and the semi-cured conductive paste is compressed so that through holes are densely filled therewith. In addition, excellent contact with the connection lands 13 is obtained, thus achieving connection with low resistance. After application of pressure and heat for a given period, the stacked structure is cooled and then taken out, thereby obtaining a multilevel semiconductor module in which the components are stacked and united with both faces of each of the semiconductor chips 2 covered with the conductive members.

In the multilevel structure, for each of the first-level second resin base 51, the second-level second resin base 52 and the third-level second resin base 53, the first-level first adhesive member 251 and the first-level second adhesive member 351, the second-level first adhesive member 252 and the second-level second adhesive member 352, or the third-level first adhesive member 253 and the third-level second adhesive member 353 may be previously attached to both faces except for the projections 310 of the second buried conductors 9 or resin bases each including an adhesive member only at one face thereof may be used (not shown).

Thereafter, if solder balls 17 are bonded to the lands formed on the lower face of the second resin board 4, a multilevel semiconductor module 1 capable of being mounted on a mother board is obtained. In the foregoing method for fabricating the semiconductor module 1 of this embodiment, the second resin board is made thick. Accordingly, a warp is less likely to occur in fabricating the multilevel semiconductor module 1 and mounting the module on a mother board. In addition, since the semiconductor chips 2 are covered with the first and second adhesive members 151 and 152, mounting with high moisture resistance and high reliability in mechanical environment is achieved. In the foregoing example, three first resin boards 3 are stacked in a module. Alternatively, four or more first resin boards 3 may be stacked.

Now, how the side and upper faces of the semiconductor chips 2 are covered with the first adhesive members 151 and 152 in the process of uniting the stacked structure described by application of heat and pressure will be more specifically described.

FIGS. 10A through 10D are cross-sectional views illustrating how the first and second adhesive members 151 and 152 cover the side and upper faces of the semiconductor chips 2 in process steps of fabricating a semiconductor module according to this embodiment.

Figure 10A:
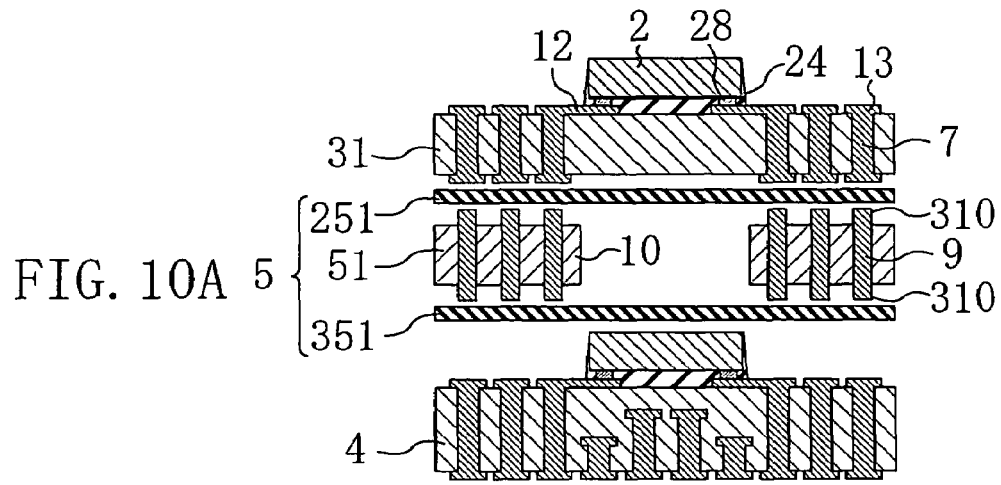
FIGS. 10A through 10D are cross-sectional views illustrating a state in which first and second adhesive members cover the side and upper faces of the semiconductor chips in process steps of fabricating a semiconductor module according to the first embodiment.

First, as illustrated in FIG. 10A, the second resin board 4 on which the semiconductor chip 2 is mounted, the first-level second adhesive member 351, the first-level second resin base 51, the first-level first adhesive member 251 and the first-level first resin board 31 on which the semiconductor chip 2 is mounted are stacked in this order with positions thereof in the width and length directions being adjusted.

Figure 10B:
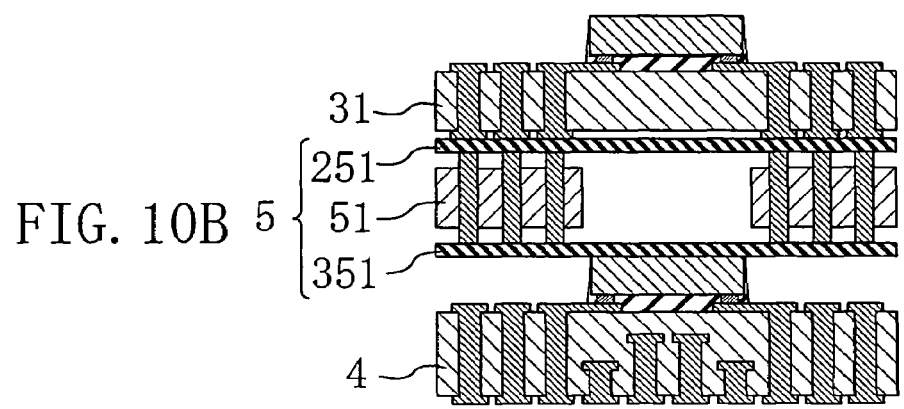

Next, as illustrated in FIG. 10B, heat is applied to the stacked structure with pressure applied between the face (i.e., the lower face) facing the surface of the second resin board 4 on which the semiconductor chip 2 is mounted and the face of the first-level first resin board 31 on which the semiconductor chip 2 is mounted. At this process step, pressure is applied until these components are in contact with each other.

Figure 10C:
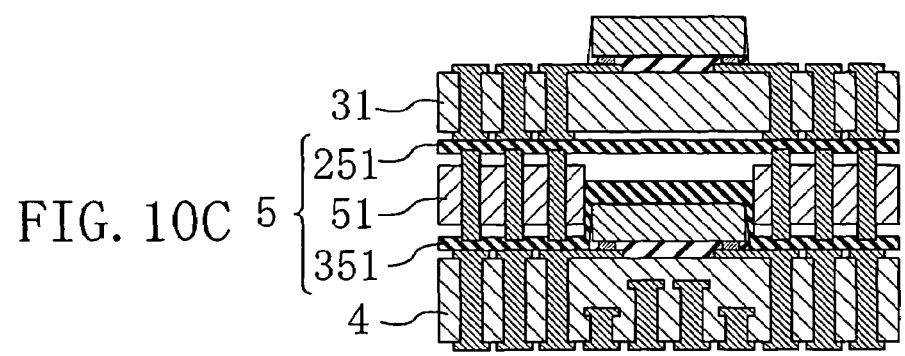

Then, as illustrated in FIG. 10C, the first-level second adhesive member 351 which is softened by heat covers the upper face (i.e., the face opposite to the principal surface) and the side face of the semiconductor chip 2 to start filling the opening 10 of the first-level second resin base 51 and, at the same time, part of the projections 310 of the second buried conductors 9 in the first-level second resin base 51 enters both of the first-level first adhesive member 251 and the first-level second adhesive member 351.

Figure 10D:
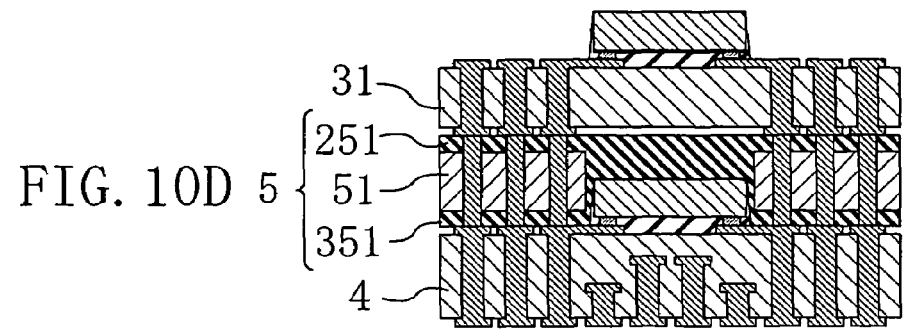

Subsequently, as illustrated in FIG. 10D, the first-level first adhesive member 251 and the first-level second adhesive member 351 completely cover the semiconductor chip 2 to completely fill the opening 10 of the first-level second resin base 51. In addition, the projections 310 at both ends of the second buried conductors 9 in a first-level resin board 3a penetrate the first-level first adhesive member 251 and the first-level second adhesive member 351 to be brought into mechanical contact with the connection lands 13 on the first-level first resin board 31 and the second resin board 4. This makes an electrical connection between the connection lands 13 and the second buried conductors 9. At the same time, the first-level first resin board 31 and the second resin board 4 are stacked and bonded together with the first-level second resin base 51 interposed therebetween, thereby obtaining a multilevel semiconductor module. With the foregoing method for fabricating the semiconductor module 1 of this embodiment, the second resin boards are made thick. Accordingly, a warp is less likely to occur even when the semiconductor module 1 has a multilevel configuration and is mounted on the mother board. In addition, since each of the semiconductor chips 2 is covered with the first and second adhesive members 151 and 152, packaging with high moisture resistance and high reliability in mechanical environment is enabled.

To fill the openings 10 with the first and second adhesive members 151 and 152, it is sufficient to apply pressure and heat in the air. Alternatively, pressure and heat may be applied in a vacuum in order to completely bury the semiconductor chips 2 with no gaps. It is also effective to previously provide holes for releasing the air in the resin boards.

In a case where the adhesive members having thick portions at their respective centers as illustrated in FIGS. 4C and 4D are used, filling of the openings 10 is further ensured as compared to the case of using adhesive members with uniform thickness.

Embodiment 2

Hereinafter, a multilevel semiconductor module 100 according to a second embodiment of the present invention will be described with reference to FIG. 11 through FIG. 14.

—Configuration of Semiconductor Module—

Figure 11:
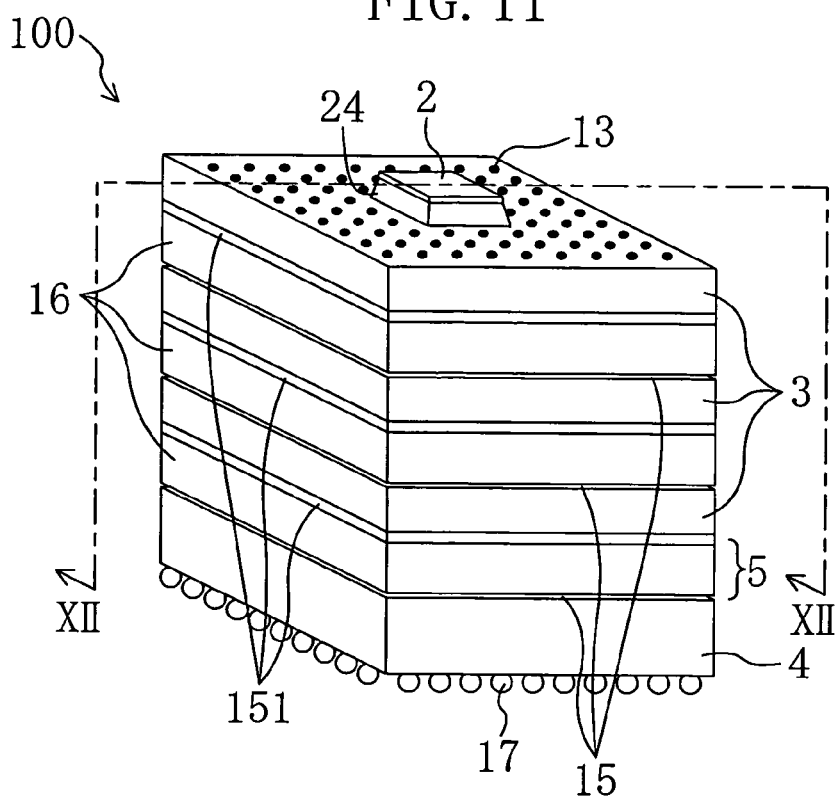
FIG. 11 is a perspective view schematically illustrating an overall configuration of a multilevel semiconductor module according to a second embodiment of the present invention.
Figure 12:
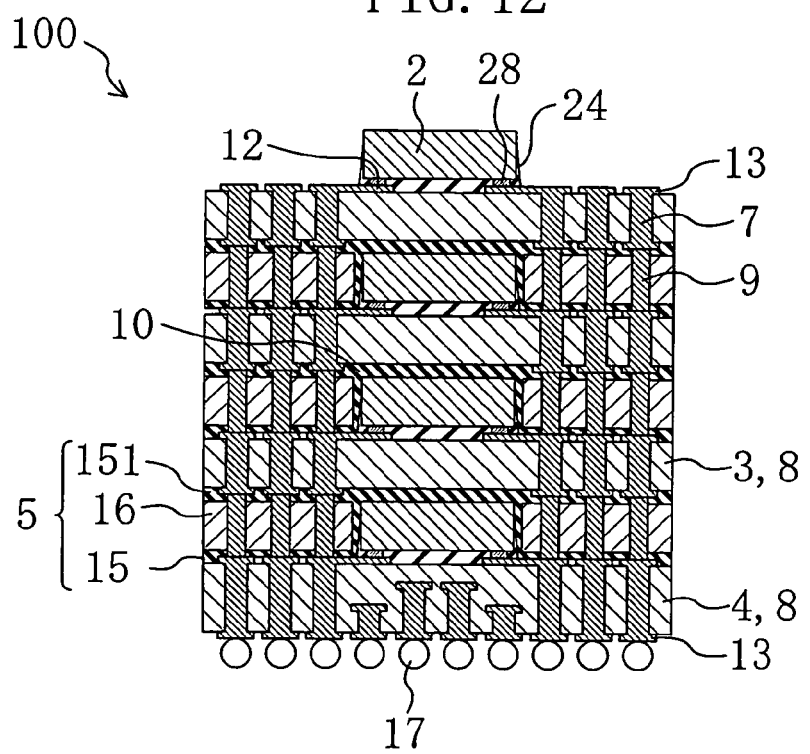
FIG. 12 is a cross-sectional view of the semiconductor module of the second embodiment taken along the line XII-XII in FIG. 11.

FIG. 11 is a perspective view schematically illustrating an overall configuration of a multilevel semiconductor module 100 according to this embodiment. FIG. 12 is a cross-sectional view of the multilevel semiconductor module of this embodiment taken along the line XII-XII in FIG. 11. In these drawings, the thicknesses and lengths, for example, of components of the semiconductor module are selected so as to be easily shown, and therefore are different from those of actual components. The numbers and shapes of buried conductors and external connection terminals for external connection are different from those of actual conductors and terminals and are selected to be easily shown in the drawings. This is also applied to the other drawings. In FIGS. 11 and 12, components already described in the first embodiment are denoted by the same reference numerals in FIGS. 1 and 2.

The multilevel semiconductor module 100 of this embodiment is different from the multilevel semiconductor module of the first embodiment in that adhesive layers (second adhesive members) 15 have been previously bonded to the lower faces of respective sheet members 5 in the step of stacking resin boards.

As illustrated in FIGS. 11 and 12, the semiconductor module 100 of this embodiment is formed by alternately stacking first resin boards 3 having upper faces on which semiconductor chips 2 are mounted and sheet members 5. In the semiconductor module 100, the resin board at the bottom (i.e., a second resin board 4) is thicker than the other resin boards and solder balls 17 serving as external connection terminals are provided on the lower face of the second resin board 4. In the semiconductor module 100, the first resin boards 3, the second resin board 4 and the sheet members 5 are stacked and united by applying heat and pressure. In the example of this embodiment, the first resin boards 3 are stacked together with the sheet members 5 in the semiconductor module 100. In the semiconductor module 100 of this embodiment, the upper faces (the back surfaces, i.e., the faces opposite to the respective principal surfaces) and the side faces of the semiconductor chips 2 are covered with first adhesive members 151 which are part of the sheet members 5. The semiconductor module of this embodiment is different from that of the first embodiment in that the semiconductor chips 2 are not covered with the second adhesive members.

The configuration of the semiconductor module of this embodiment will be more specifically described.

The structures of the first resin boards 3 and the second resin board 4 used in the semiconductor module 100 of this embodiment are the same as those in the first embodiment, and description thereof will be omitted.

Each of the sheet members 5 includes: a second resin base 16 in which an opening 10 capable of accommodating a semiconductor chip 2 is formed in a center region; second buried conductors 9 made of a conductive resin material and buried in the second resin base 16 at positions corresponding to first buried conductors 7 in a first resin board 3; an adhesive layer 15 in which an opening 10 capable of accommodating the semiconductor chip 2 is formed in a center region and provided on the lower face of the second resin base 16; a first adhesive member 151 provided on the upper face of the second resin base 16, covering, in a center portion, the upper and side faces of the semiconductor chip 2 and filling the opening 10.

The first adhesive member 151 and the adhesive layer 15 are made of materials which are softened to be adhesive when heated, or may be made of an identical material.

Both ends of each of the second buried conductors 9 project from the surfaces of the second resin base 16, the first adhesive member 151 and the adhesive layer 15 to a given height to form projections 310. The second buried conductors 9 are semi-cured before stacking. The second buried conductors 9 are compressed and cured by application of pressure and heat after stacking, and electrically connected to the first buried conductors 7 in the first resin boards 3 and the second resin board 4 mainly by mechanical contact. The upper faces of the second resin bases 16 forming the respective sheet members 5 are the same as that shown in FIG. 5A. In the semiconductor module 100, the first adhesive members 151 each bonding the lower face (i.e., the face opposite to the mount face) of the first resin board 3 and the upper face of the sheet member 5 is the same as the first adhesive members 151 of the first embodiment, and thus description thereof is omitted. Each of the first adhesive members 151 may have a uniform thickness or is thicker in a center portion than in the other portion.

The semiconductor module 100 of this embodiment has the foregoing structure. The first resin bases 8 forming the first resin boards 3 and the second resin board 4 and the second resin bases 16 forming the sheet members 5 may be made of an identical material such as a glass-epoxy resin or an aramid-epoxy resin. Alternatively, the first resin boards 3 and the second resin board 4 may be made of different materials. For example, a glass-epoxy resin may be used for the first resin boards 3 and the second resin board 4 and an aramid-epoxy resin may be used for the sheet members 5. The outer dimensions of the first resin boards 3, the second resin board 4 and the sheet members 5 are the same in plan view. The first adhesive members 151 and the adhesive layers 15 provided in the sheet members 5 may be made of a prepreg of a glass-epoxy resin or an aramid-epoxy resin, for example. The outer dimensions thereof are the same as those of the resin boards in plan view.

Before the resin boards and the sheet members 5 are stacked, a first-level first adhesive member 251, a second-level first adhesive member 252 and a third-level first adhesive member 253 may be attached to the faces (i.e., the upper faces) of a first-level second resin base 51, a second-level second resin base 52 and a third-level second resin base 53, respectively, on which the adhesive layers 15 are not provided except for projections 310 of the second buried conductors 9 (not shown, see FIG. 9 for reference numerals).

Alternatively, a structure in which adhesive members are provided on the lower faces of the respective second resin bases 16 whereas the adhesive layers 15 are previously attached to the upper faces thereof before stacking the boards and the sheet members may be provided (not shown).

The semiconductor module 100 of this embodiment described above has substantially the same advantages as those of the semiconductor module 1 of the first embodiment. In the semiconductor module of this embodiment, the second resin board 4 at the bottom is thicker than each of the first resin boards 3, so that a warp is greatly suppressed even in a multilevel configuration. In addition, in the semiconductor module 100 of this embodiment, the first and second adhesive members 151 and 152 cover the side and upper faces of the semiconductor chips 2, water, moisture, corrosive gas and other substances causing corrosion of a wire material are less likely to enter the openings 10, so that occurrence of failures due to disconnection of wires is prevented. That is, moisture resistance of the semiconductor module 100 of this embodiment is higher than a conventional semiconductor module. Accordingly, failures are less likely to occur in mounting the module on a mother board using the solder balls 17. As a result, a highly-reliable semiconductor module is implemented at low cost.

In addition, if the second resin bases 16 having high stiffness and forming the sheet members 5 are made thicker than the semiconductor chips 2, loads applied to the semiconductor chips 2 are reduced during fabrication, thus preventing failures from occurring in the semiconductor chips 2 themselves and in connection portions between the semiconductor chips 2 and the resin boards.

—Method for Fabricating Semiconductor Module—

Now, a process of stacking and uniting the first and second resin boards 3 and 4 on which the semiconductor chips 2 are mounted and the sheet members 5 located between the resin boards will be described with reference to FIGS. 13A through 13G and FIG. 14.

FIGS. 13A through 13G are cross-sectional views illustrating process steps of fabricating a sheet member for use in the semiconductor module of this embodiment. FIG. 14 is a view showing the semiconductor module of this embodiment illustrated in FIGS. 11 and 12 in a disassembled state.

First, as shown in FIG. 13A, as a second resin base 16 of a sheet member 5 of this embodiment, a glass fabric epoxy resin thicker than a semiconductor chip 2, for example, is prepared. For example, if the semiconductor chip 2 has a thickness of 75 μm, the thickness of the second resin base 16 is preferably about 100 μm.

Next, as shown in FIG. 13B, a prepreg adhesive layer (adhesive layer 15) made of a glass-epoxy resin or an aramid-epoxy resin is formed on one face of the second resin base 16. This adhesive layer 15 has a thickness of 20 μm or more.

Then, as shown in FIG. 13C, heat-resistance protective films 205 made of polyimide or PET resin are formed on both faces of the second resin base 16.

Thereafter, as illustrated in FIG. 13D, through holes 90 are formed in given portions of the second resin base 16, the adhesive layer 15 and the heat-resistance protective films 205 with a laser. Simultaneously with the formation of the through holes 90, an opening 10 capable of accommodating the semiconductor chip 2 is formed in a center region of the second resin base 16. Thereafter, the heat-resistance protective films 205 are peeled off from the second resin base 16 and the adhesive layer 15.

Then, as illustrated in FIG. 13E, masking films 21 in which holes are formed at positions corresponding to the through holes 90 when viewed from above are attached to the upper face of the second resin base 16 and the lower face of the adhesive layer 15. These holes are used to form projections 310 of the second buried conductors 9. Thereafter, the through holes 90 are filled with a conductive paste by, for example, screen printing. At this time, the masking film 21 provided on the face on which the adhesive layer 15 is formed is thinner than that provided on the other face. In this manner, the projections 310 of the second resin base 16 from the upper face of the second buried conductors 9 and the projections 310 from the lower face of the second resin base 16 have the same height. It should be noted that the heights of the projections 310 are not necessarily the same on both faces of the second resin base 16 and may differ from each other.

Subsequently, as illustrated in FIG. 13F, the conductive paste filling the through holes 90 and the holes in the masking films 21 is heated with application of pressure, so that the conductive paste comes to have a higher filling density to be electrically low-resistive and is changed into a semi-cured state.

Then, as shown in FIG. 13G, the masking films 21 are peeled off from the second resin base 16, thereby forming a second resin base 16 having the adhesive layer 15 at one face of a sheet member 5. The second buried conductors 9 are still semi-cured at the end of this process step, so that the second buried conductors 9 have the property of being compressed and cured simultaneously upon application of pressure and heat.

A method for mounting a semiconductor chip 2 on each resin board, a method for connecting the solder balls 17 to the second resin board 4 and other methods are the same as those described in the first embodiment, and descriptions thereof will be omitted.

With the foregoing structure of the sheet member 5, the number of components is reduced so that fabrication cost is reduced, in addition to the advantages of the semiconductor module of the first embodiment.

Then, a process in which the first and second resin boards 3 and 4 on which the semiconductor chips 2 are mounted and the sheet members 5 each including the second resin base 16 provided with the adhesive layer 15 at one face and the first adhesive member 151 are stacked and united together will be described with reference to FIG. 14. In FIG. 14, to simplify description, the three first resin boards 3 are individually referred to as a first-level first resin board 31, a second-level first resin board 32 and a third-level first resin board 33. Likewise, the second resin bases 16 forming the respective sheet members 5 are referred to as a first-level second resin base 51, a second-level second resin base 52 and a third-level second resin base 53. The first adhesive members 151 are also referred to as a first-level first adhesive member 251, a second-level first adhesive member 252 and a third-level first adhesive member 253.

As illustrated in FIG. 14, the second resin board 4 is located at the bottom. Over the second resin board 4, the first-level second resin base 51, the first-level first adhesive member 251 and the first-level first resin board 31 are placed in this order. Then, a second-level second resin base 52, a second-level first adhesive member 252, a second-level first resin board 32, a third-level second resin base 53, a third-level first adhesive member 253 and a third-level first resin board 33 are placed in this order.

These components are stacked in such a manner that the semiconductor chips 2 mounted on the first resin boards 3 overlap with the semiconductor chip 2 mounted on the second resin board 4 when viewed from above. The first resin boards 3 and the second resin board 4 are placed such that the semiconductor chips 2 are housed in the respective openings 10 of the second resin bases 16. The connection lands 13 of the first resin boards 3 and the second resin board 4 are accurately positioned with respect to the projections 310 of the second buried conductors 9 provided in the sheet members 5.

With this arrangement, the resin boards and the sheet members 5 are stacked and are made in close contact with each other. Thereafter, the stacked structure is subjected to heat and pressure in the atmosphere. Accordingly, the first adhesive members 151 provided at the first through third levels and the adhesive layer 15 provided on one face of each of the second resin bases 16 are softened so that the second resin board 4 and the first-level through third-level first resin boards 31 through 33 are bonded together. In addition, the second resin board 4 and the connection lands 13 on the first-level first resin board 31 through the third-level first resin board 33 are also bonded together. At this time, the projections 310 of the second buried conductors 9 penetrate the softened first adhesive member 151 provided on one face of each of the second resin bases 16 to be brought into mechanical contact with the first buried conductors 7, thereby forming an electrical connection. At the same time, the first adhesive member 151 flows to be injected into the opening 10 in the second resin base 16, so that the upper and side faces of the semiconductor chip 2 housed in the opening 10 are covered and the opening 10 is filled with the first adhesive member 151.

That is, with application of pressure and heat, the first adhesive member 151 is softened and the semi-cured conductive paste is compressed, so that the through holes are filled therewith with high density. In addition, a good contact with the connection lands 13 is formed and connection with low resistance is obtained. After application of pressure and heat for a given period, the stacked structure is cooled and then taken out, thereby obtaining a multilevel semiconductor module in which the components are stacked and united with the semiconductor chips 2 covered with the first adhesive members 151.

With the foregoing method for fabricating the semiconductor module 100 of this embodiment, the second resin board 4 is made thick, so that a warp is less likely to occur in the case of having a multilevel structure or mounting the module on a mother board. In addition, since the semiconductor chips 2 are covered with the first adhesive members 151, moisture resistance and reliability in mechanical environment are enhanced as compared to a conventional semiconductor module.

Embodiment 3

Hereinafter, a multilevel semiconductor module 110 according to a third embodiment of the present invention will be described with reference to FIGS. 15 through 18.

Figure 15:
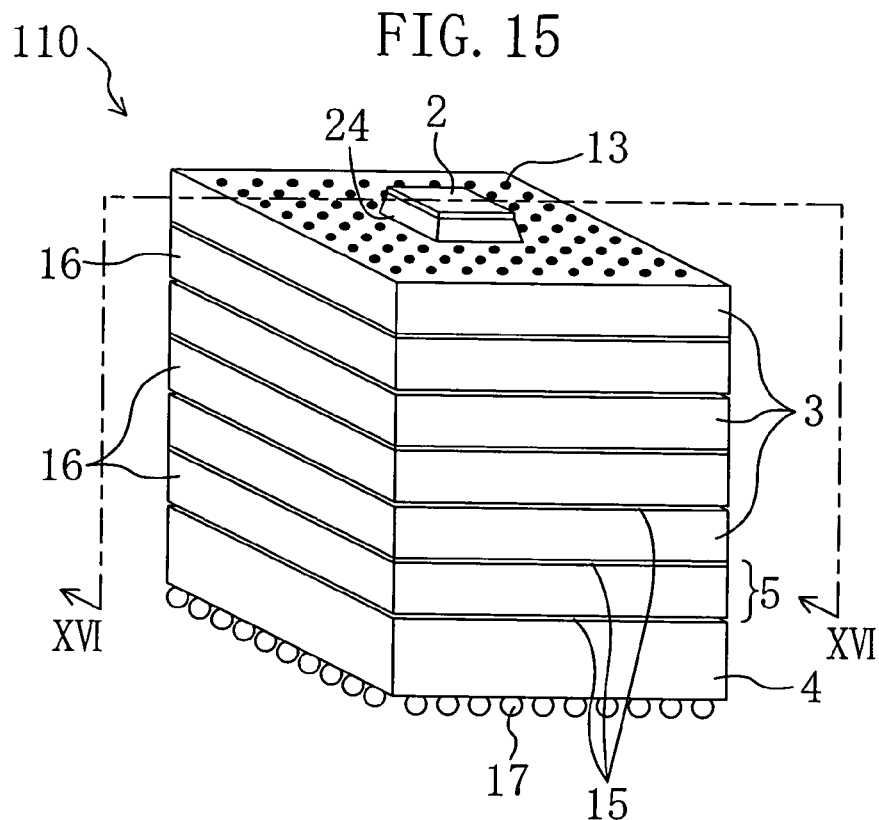
FIG. 15 is a perspective view schematically illustrating an overall configuration of a semiconductor module according to a third embodiment of the present invention.
Figure 16:
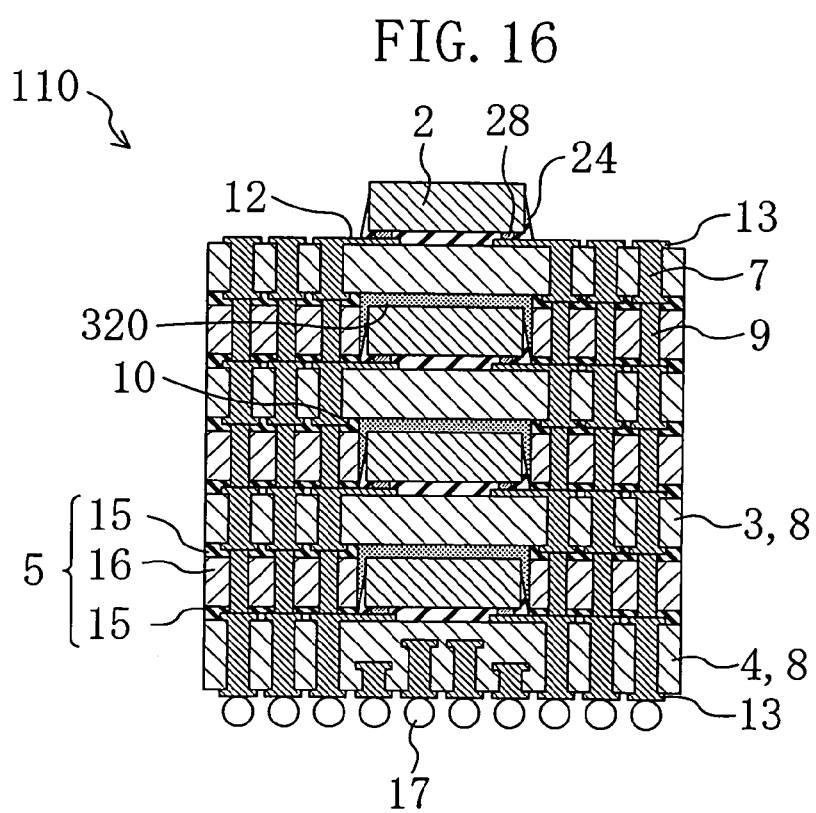
FIG. 16 is a cross-sectional view of the semiconductor module of the third embodiment taken along the line XVI-XVI in FIG. 15.

FIG. 15 is a perspective view schematically illustrating an overall configuration of a multilevel semiconductor module according to the third embodiment. FIG. 16 is a cross-sectional view of the semiconductor module of this embodiment taken along the line XVI-XVI in FIG. 15. In FIGS. 15 and 16, components already described in the first and second embodiments are denoted by the same reference numerals in FIGS. 1 and 2 and FIGS. 11 and 12.

—Configuration of Semiconductor Module—

As illustrated in FIGS. 15 and 16, the semiconductor module 110 of this embodiment includes a second resin board 4 on which a semiconductor chip 2 is mounted and a stacked structure provided on the second resin board 4. The stacked structure is formed by alternately stacking sheet members 5 provided with openings 10 for housing semiconductor chips 2 and first resin boards 3 on which semiconductor chips 2 are mounted. The second resin board 4 at the bottom of the resin boards is thicker than each of the first resin boards 3. Solder balls 17 serving as external connection terminals for connection to a mother board (not shown) are provided on the lower face of the second resin board 4. The second resin board 4 and the first resin boards 3 are bonded together and are united with adhesive layers 15 which are part of the sheet members 5.

The semiconductor module 110 of this embodiment is characterized in that the upper face (i.e., back surface) and side faces of each of the semiconductor chips 2 housed in the openings 10 are covered with a low-stress resin 320 which is softened at a temperature lower than that for the adhesive layers 15 and the openings 10 are filled with the low-stress resin 320.

The configuration of the semiconductor module of this embodiment will be more specifically described.

The structures of the first resin boards 3 and the second resin board 4 used in the semiconductor module 110 of this embodiment are the same as those in the first embodiment, and description thereof will be omitted.

Each of the sheet members 5 includes: a second resin base 16 in which an opening 10 capable of accommodating a semiconductor chip 2 is formed in a center portion; second buried conductors 9 made of a conductive resin material and buried in the second resin base 16 at positions corresponding to first buried conductors 7 in a first resin board 3; and adhesive layers 15 in which openings 10 capable of accommodating the semiconductor chip 2 are formed in center portions thereof and respectively provided on the upper and lower faces of the second resin base 16.

As described above, the upper and side faces of the semiconductor chips 2 other than the semiconductor chip 2 located at the top are covered with the low-stress resin 320. The low-stress resin 320 is made of a material which is softened at a temperature lower than that for the adhesive layers 15 and has a stiffness lower than that of the adhesive layers 15 at room temperature. As a material for the low-stress resin 320, an epoxy resin, a butadiene-based resin or a resin obtained by modifying these resins using another low-stress resin having a low softening point may be used. The low-stress resin 320 is provided on the sheet members 5 in the stacking step. In each of the sheet members 5 before the stacking, the thickness of the low-stress resin 320 is preferably smaller than that of the second resin base 16.

Both ends of each of the second buried conductors 9 in the sheet members 5 project from the surfaces of the second resin bases 16 and the adhesive layers 15 to form projections 310 and are semi-cured before being stacked in fabrication. The second buried conductors 9 are brought into mechanical contact with the first buried conductors 7 under application of heat and pressure during fabrication, and are electrically connected to the first buried conductors 7 and semiconductor devices, for example, formed on the semiconductor chips 2. The second resin bases 16 forming the sheet members 5 are the same as that described in the first embodiment with reference to FIG. 5A.

With the foregoing structure of the semiconductor module 110 of this embodiment, stress applied to the semiconductor chips 2 mounted on the resin boards are reduced, thus preventing disconnection and connection failures in the semiconductor chips 2 and connection failures between the semiconductor chips 2 and the resin boards, for example.

The first resin bases 8 forming the first resin boards 3 and the second resin board 4 and the second resin bases 16 forming the sheet members 5 may be made of an identical material such as a glass-epoxy resin or an aramid-epoxy resin. Alternatively, the first and second resin boards 3 and 4 may be made of different materials from that of the sheet members 5. For example, a glass-epoxy resin may be used for the first and second resin boards 3 and 4 and an aramid-epoxy resin may be used for the sheet members 5. The outer dimensions of the sheet members 5 are the same as those of the resin boards in plan view. To bond the second resin base 16 forming the sheet members 5 and the first and second resin boards 3 and 4 together, adhesive layers 15 made of a prepreg of a glass-epoxy resin or an aramid-epoxy resin, for example, may be used.

—Method for Fabricating Semiconductor Module—

Now, a process of stacking and uniting the first and second resin boards 3 and 4 on which the semiconductor chips 2 are mounted and the sheet members 5 placed between the resin boards will be described with reference to FIGS. 17A through 17G and FIG. 18.

FIGS. 17A through 17G are cross-sectional views illustrating process steps of fabricating a sheet member for use in the semiconductor module of this embodiment. FIG. 18 is a view showing the semiconductor module of this embodiment illustrated in FIGS. 15 and 16 in a disassembled state.

Figure 17A:
FIGS. 17A through 17G are cross-sectional views illustrating a method for forming a sheet member for use in the semiconductor module of the third embodiment.
Figure 18:
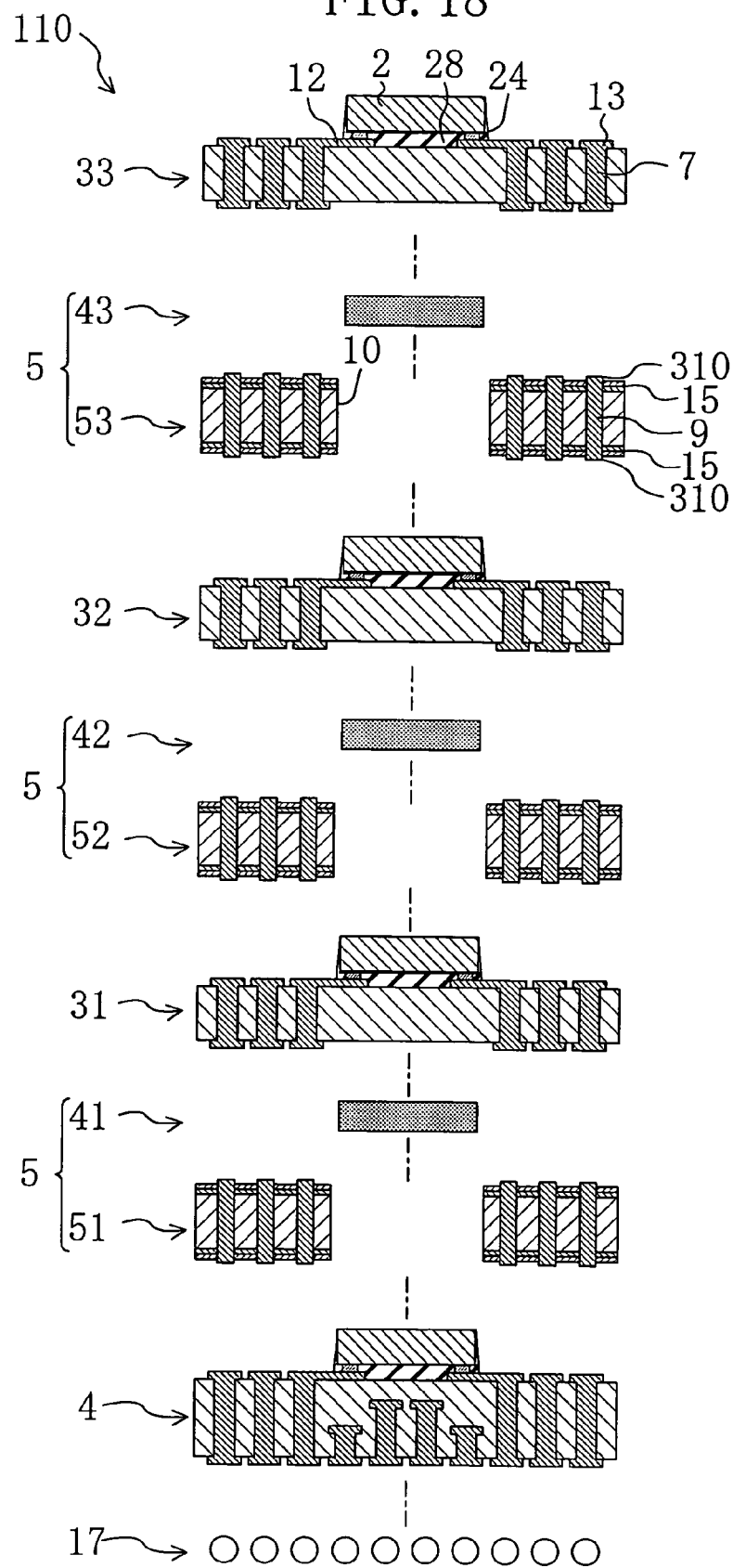
FIG. 18 is a view showing the semiconductor module of the third embodiment illustrated in FIGS. 15 and 16 in a disassembled state.

First, as shown in FIG. 17A, as a second resin base 16 of a sheet member 5 of this embodiment, a glass fabric epoxy resin thicker than a semiconductor chip 2 is prepared. For example, if the semiconductor chip 2 has a thickness of 75 μm, the thickness of the second resin base 16 is preferably about 100 μm.

Figure 17B:
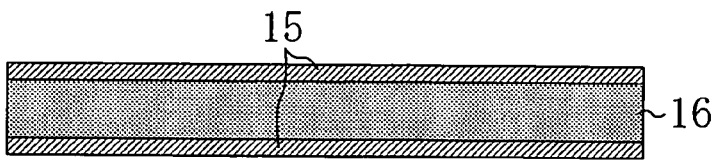

Next, as shown in FIG. 17B, prepreg adhesive layers (adhesive layers 15) formed by using a glass-epoxy resin or an aramid epoxy resin are formed on both faces of the second resin base 16. Each of the adhesive layers 15 has a thickness of 20 μm or more.

Figure 17C:
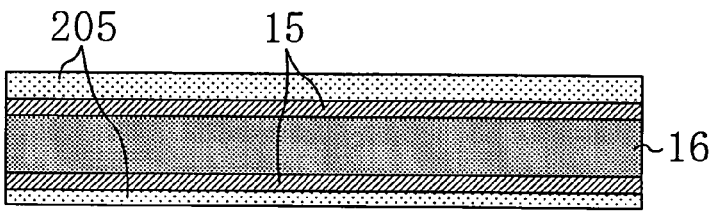

Then, as shown in FIG. 17C, heat-resistance protective films 205 made of polyimide or PET resin are formed on both faces of the second resin base 16.

Figure 17D:
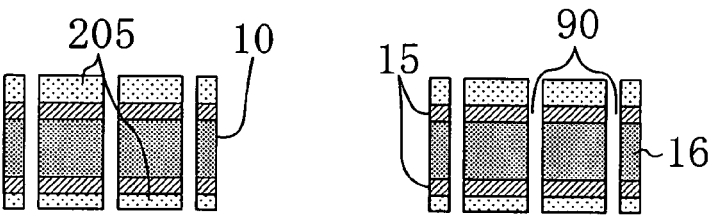

Thereafter, as illustrated in FIG. 17D, through holes 90 are formed in given portions of the second resin base 16, the adhesive layers 15 and the heat-resistance protective films 205 with a laser. Simultaneously with the formation of the through holes 90, an opening 10 capable of accommodating the semiconductor chip 2 is formed in a center region of the second resin base 16. Thereafter, the heat-resistance protective films 205 are peeled off from the adhesive layers 15.

Figure 17E:
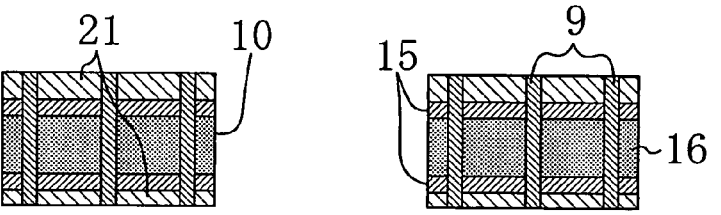

Then, as illustrated in FIG. 17E, masking films 21 in which holes are formed at positions overlapping with the through holes 90 in plan view are attached to the adhesive layers 15 formed on both faces of the second resin base 16. These holes are used to form projections 310 of the second buried conductors 9. Thereafter, the through holes 90 are filled with a conductive paste by, for example, screen printing.

Figure 17F:
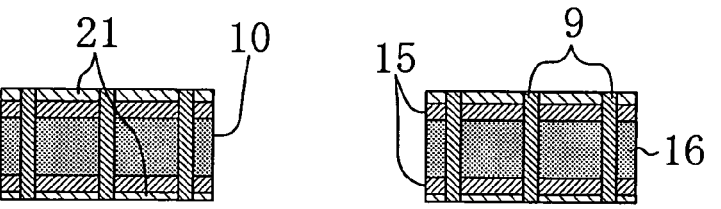

Subsequently, as illustrated in FIG. 17F, the conductive paste filling the through holes 90 and the holes in the masking films 21 is heated with application of pressure, so that the conductive paste comes to be electrically low-resistive with the filling density increased and is changed into a semi-cured state.

Figure 17G:
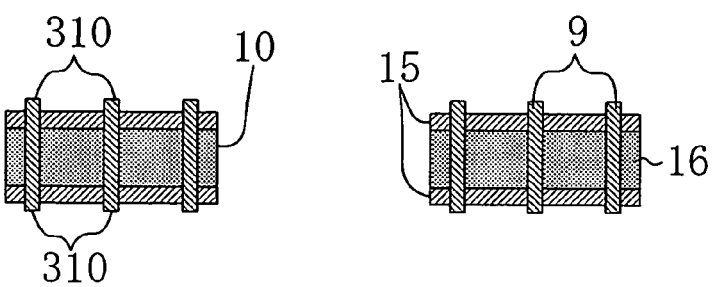

Lastly, as shown in FIG. 17G, the masking films 21 are peeled off from the second resin base 16, thereby forming a second resin base 16 having the adhesive layers 15 at both faces of a sheet member 5. The second buried conductors 9 are still semi-cured at the end of this process step, so that the second buried conductors 9 have the property of being compressed and cured simultaneously with application of pressure and heat.

A method for mounting a semiconductor chip 2 on each resin board, a method for connecting the solder balls 17 to the second resin board 4 and other methods are the same as those described in the first embodiment, and descriptions thereof will be omitted.

The foregoing structure of the sheet members 5 allows a semiconductor module to be formed without using adhesive members as illustrated in FIGS. 4A through 4D. In this case, since adhesive members having a shape similar to that of the semiconductor chips 2 are additionally provided, the adhesive members are easily formed as compared to the semiconductor module of the first embodiment. Accordingly, adhesive members are easily formed, so that fabrication cost of a semiconductor module is reduced, in addition to the advantages of the semiconductor module of the first embodiment.

Then, a process in which the first and second resin boards 3 and 4 on which the semiconductor chips 2 are mounted and the sheet members 5 each including the second resin base 16 provided with the adhesive layers 15 on both faces thereof and the low-stress resin 320 are stacked and united together will be described with reference to FIG. 18. In FIG. 18, to simplify description, the three first resin boards 3 are individually referred to as a first-level first resin board 31, a second-level first resin board 32 and a third-level first resin board 33. Likewise, the low-stress resin 320 provided in three levels is individually referred to as a first-level low-stress resin 41, a second-level low-stress resin 42 and a third-level low-stress resin 43. The second resin bases 16 forming the respective sheet members 5 are also referred to as a first-level second resin base 51, a second-level second resin base 52 and a third-level second resin base 53.

As illustrated in FIG. 18, the second resin board 4 is located at the bottom. Over the second resin board 4, the first-level second resin base 51, the first-level low-stress resin 41 and the first-level first resin board 31 are placed in this order. Then, a second-level second resin base 52, the second-level low-stress resin 42, a second-level first resin board 32, a third-level second resin base 53, the third-level low-stress resin 43 and a third-level first resin board 33 are placed in this order.

These components are stacked in such a manner that the semiconductor chips 2 mounted on the first resin boards 3 overlap with the semiconductor chip 2 mounted on the second resin board 4 when viewed from above. The first resin boards 3 and the second resin board 4 are placed such that the semiconductor chips 2 are housed in the openings 10 of the second resin bases 16.

Then, the low-stress resin 320 smaller than the openings 10 in plan view and made of a material which is softened at a temperature lower than that for the adhesive layers 15 and has a stiffness lower than that of the adhesive layers 15 is placed on each of the semiconductor chips 2 housed in the openings 10.

Thereafter, the first resin board 3, the sheet member 5 and the low-stress resin 320 at the next level are placed. The connection lands 13 of the first resin boards 3 and the second resin board 4 are accurately positioned with respect to the projections 310 of the second buried conductors 9 buried in the second resin bases 16.

With this arrangement, the resin boards and the sheet members 5 are stacked and are brought in close contact with each other. Thereafter, the stacked structure is subjected to heat and pressure in the atmosphere. Accordingly, the low-stress resin 320 provided at the first through third levels is softened, and then the adhesive layers 15 in contact with both faces of each of the resin boards are softened. In this manner, the second resin board 4 and the first-level first resin board 31 through the third-level first resin board 33 are bonded to the respective adjacent second resin bases. In addition, the second resin board 4, the connection lands 13 on the first-level through third-level first resin boards 31 through 33 and the projections 310 of the second buried conductors 9 are brought into mechanical contact with each other, thereby establishing electrical connection. At the same time, the low-stress resin 320 flows to cover the upper and side faces of the semiconductor chips 2 housed in the openings 10, resulting in that the openings 10 are filled with the low-stress resin 320.

That is, with application of pressure and heat, the adhesive layers 15 are softened and the semi-cured conductive paste is compressed to fill the through holes with high density. In addition, an excellent contact with the connection lands 13 is formed and connection with low resistance is formed. After application of pressure and heat for a given period, the stacked structure is cooled and then taken out, thereby obtaining a multilevel semiconductor module in which the semiconductor chips 2 are covered with the low-stress resin 320 and the stacked resin boards on which semiconductor chips are respectively mounted are united.

Embodiment 4

Figure 19:
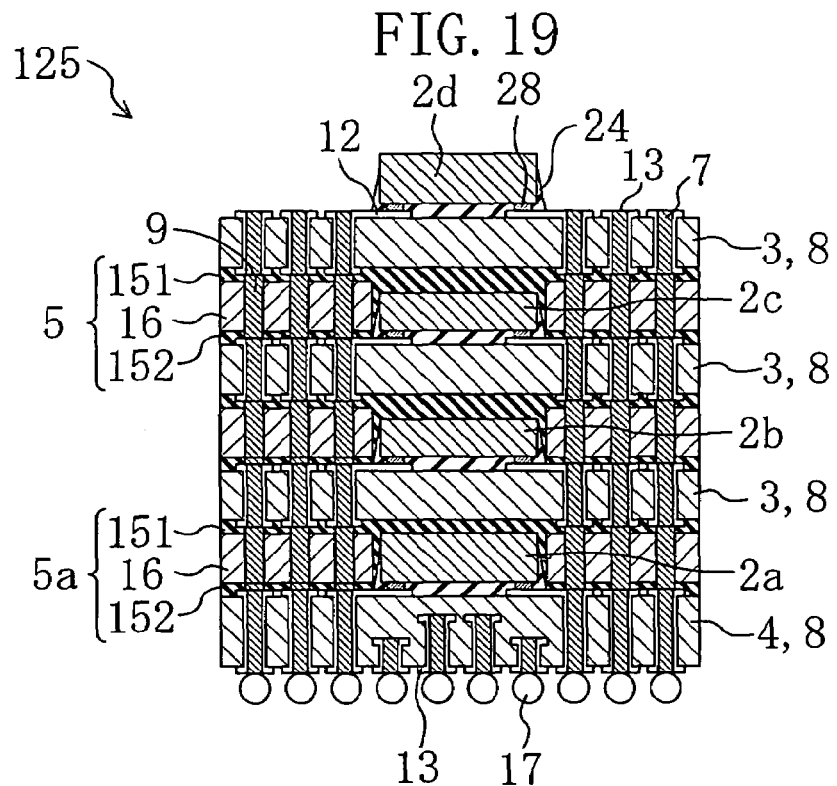
FIG. 19 is a cross-sectional view illustrating an overall configuration of a semiconductor module according to a fourth embodiment of the present invention.

Hereinafter, a multilevel semiconductor module according to a fourth embodiment of the present invention will be described with reference to FIG. 19. FIG. 19 is a cross-sectional view illustrating an overall configuration of the semiconductor module of the fourth embodiment.

As illustrated in FIG. 19, a semiconductor module 125 according to this embodiment is characterized in that semiconductor chips 2a and 2d mounted on a first resin board 3 located at the top and a second resin board 4 located at the bottom, respectively, are thicker than semiconductor chips 2b and 2c mounted on the other first resin boards 3. Accordingly, a lower sheet member 5a out of sheet members 5 in the semiconductor module 125 of this embodiment has a large thickness. With respect to the other aspects, the semiconductor module 125 of this embodiment is the same as the semiconductor modules 1, 100 and 110 of the first through third embodiments, and description thereof will be omitted.

With the foregoing configuration of the semiconductor module 125, the stiffness of the semiconductor chips 2a and 2d is increased, so that occurrence of a warp is suppressed in forming a module. In addition, the semiconductor chips 2a and 2d at the top and bottom, respectively, to which pressure is readily applied during application of pressure and heat, are made thick so that the multilevel semiconductor module 125 which has high moisture resistance and in which cracks and other failures are less likely to occur even during application of pressure to semiconductor devices is obtained.

Embodiment 5

Figure 20:
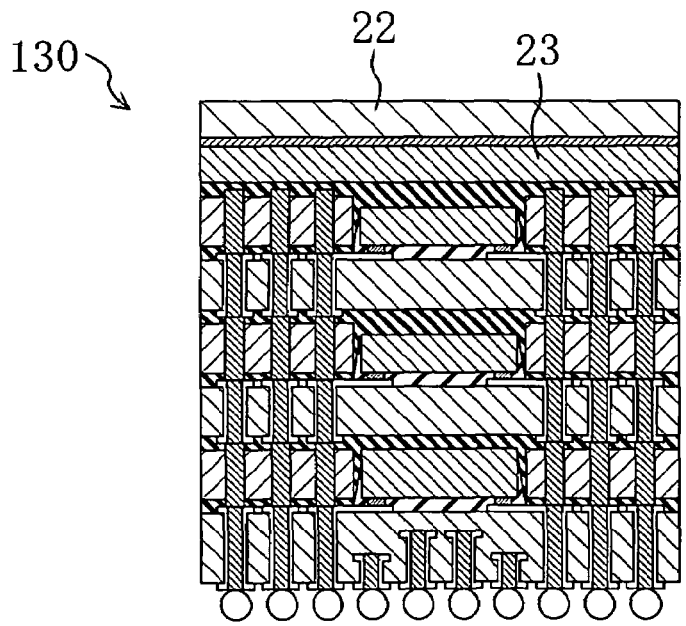
FIG. 20 is a cross-sectional view illustrating a configuration of a semiconductor module according to a fifth embodiment of the present invention.

Hereinafter, a multilevel semiconductor module 130 according to a fifth embodiment of the present invention will be described with reference to FIG. 20. FIG. 20 is a cross-sectional view illustrating a configuration of the semiconductor module 130 of the fifth embodiment.

As illustrated in FIG. 20, the semiconductor module 130 of this embodiment is different from the semiconductor modules 1, 100 and 110 of the first through third embodiments in that a rigid plate 22 having the same size as that of first resin boards 3 in plan view is attached to the resin board at the top level of the module.

Specifically, in addition to the configurations of the semiconductor modules of the first through third embodiments, the semiconductor module 130 of this embodiment further includes: a resin base 23 attached to the first resin board 3 at the top of the resin boards and having the same outer shape as that of the first resin boards 3 in plan view; and a rigid plate 22 attached to the resin base 23, having the same outer shape as that of the first resin boards 3 and having a thermal conductivity higher than those of first resin bases 8 and second resin bases 16.

As a method for bonding the resin base 23 and the rigid plate 22 together, in the process of stacking the resin boards and the sheet members 5, the resin base 23 and the rigid plate 22 may be stacked together with the other components to be united with the resultant stacked structure at a time by application of pressure and heat. Alternatively, after a multilevel semiconductor module has been formed, the base 23 and the rigid plate 22 may be attached to the module.

The rigid plate 22 may be made of a metal having a high stiffness and a high thermal conductivity such as copper, iron, aluminum or 42 alloy or, for example, a ceramic material such as zirconia or plastic containing metal powder.

In addition, a warp occurring in, for example, the semiconductor module 1 of the first embodiment may be measured so that the thickness and material of the rigid plate 22 are selected so as to cancel this warp. Alternatively, in fabricating the module under given conditions, if it is previously known that a warp occurs in one direction, a rigid plate 22 designed to cancel the warp during application of pressure and heat may be placed at the top before application of pressure and heat. To cancel a warp, it is sufficient to obtain a material having a thermal expansion coefficient different from those of the bases, the resin boards and the sheet members and the thickness thereof by calculation, according to the direction of the warp. Accordingly, a semiconductor module in which a warp is minimized is fabricated, and occurrence of connection failures between a mother board and solder balls 17 is suppressed.

In this manner, in the semiconductor module 130 of this embodiment, occurrence of a warp in the entire module is suppressed. Accordingly, the rigid plate 22 allows heat to be uniformly applied to the sheet members and the resin boards during heating.

All the semiconductor chips 2 in the semiconductor module 130 may have the same thickness. Alternatively, the semiconductor chip 2 mounted on the second resin board 4 may be thicker than the semiconductor chips 2 on the first resin boards 3. In this case, an upper portion of the module is reinforced by the rigid plate 22 and a warp of the semiconductor module is more effectively suppressed.

Figure 21:
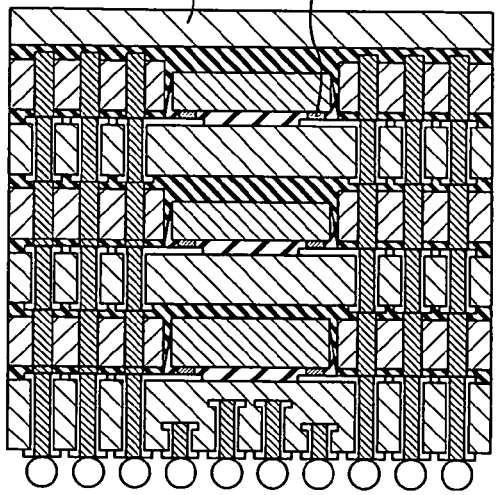
FIG. 21 is a cross-sectional view illustrating a modified example of the semiconductor module of the fifth embodiment.

FIG. 21 is a cross-sectional view illustrating a modified example of the multilevel semiconductor module 130 of this embodiment.

A semiconductor module 140 according to this modified example is characterized by including a rigid plate 22 attached to a sheet member 5 instead of the first resin board 3 which is located at the top in the semiconductor modules 1, 100 and 110 of the first through third embodiments and on which the semiconductor chip 2 is mounted. In this example, at least a surface portion of the rigid plate 22 has an insulating property. In this structure, a material having the property of canceling a warp may also be selected as the rigid plate 22.

Embodiment 6

Figure 22:
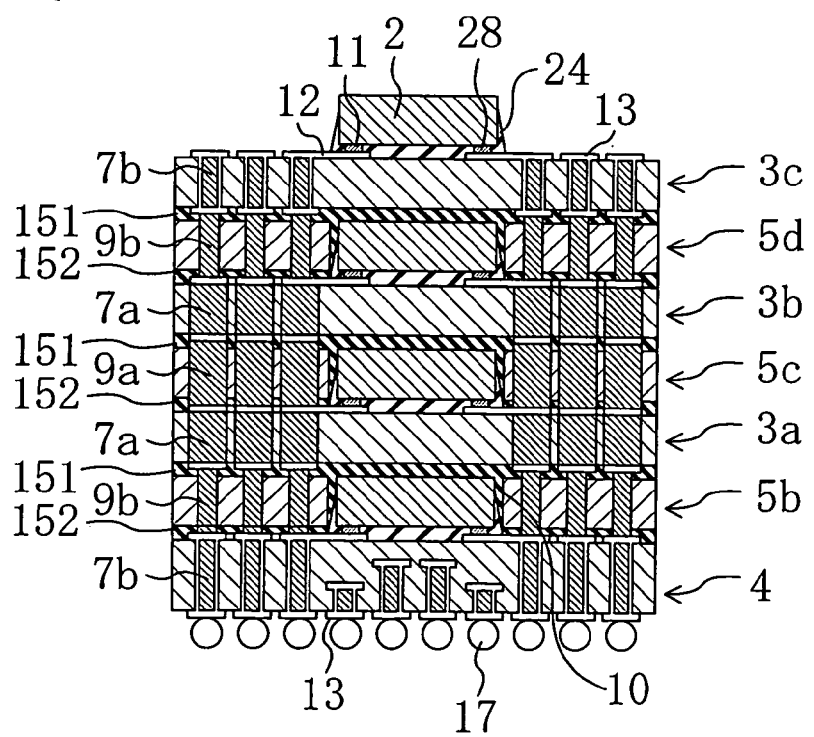
FIG. 22 is a cross-sectional view illustrating a configuration of a semiconductor module according to a sixth embodiment of the present invention.

Hereinafter, a multilevel semiconductor module 170 according to a sixth embodiment of the present invention will be described with reference to FIG. 22. FIG. 22 is a cross-sectional view illustrating a configuration of the semiconductor module of the sixth embodiment.

In the semiconductor module 170 of this embodiment, the diameter of first buried conductors 7a formed in first resin boards 3a and 3b located at a middle level is larger than that of first buried conductors 7b formed in a first resin boards 3c located at the top of the resin boards and in a second resin board 4.

In addition, the diameter of second buried conductors 9a formed in a sheet member 5c at a middle level is also larger than that of second buried conductors 9b formed in a sheet member 5b placed on the second resin board 4 at the bottom (of the resin boards) and a sheet members 5d under the first resin board 3c located at the top.

During application of heat and pressure to the stacked components, pressure is not readily applied to the sheet members 5 and the first resin boards 3 near the middle level so that the first buried conductors 7 and the second buried conductors 9 are not sufficiently compressed in some cases. However, in the semiconductor module of this embodiment, the first resin boards 3 and the sheet members 5 are alternately stacked and the second resin board 4 is placed at the bottom so that electrical resistance of all the buried conductors including those at the middle level is made uniform during application of heat and pressure for uniting these components. Accordingly, even when pressure and heat are insufficiently supplied to the middle level of the semiconductor module as compared to the upper and lower levels of the module, the resistance of the buried conductors at the middle level is reduced. In addition, as in the semiconductor modules of the foregoing embodiments, the upper and side faces of the semiconductor chips 2 are covered with adhesive layers or adhesive members, so that the semiconductor module 170 of this embodiment has high moisture resistance.

Embodiment 7

A multilevel semiconductor module according to a seventh embodiment of the present invention will be described with reference to FIGS. 23A and 23B, FIGS. 24A and 24B and FIG. 25.

Figure 23A:
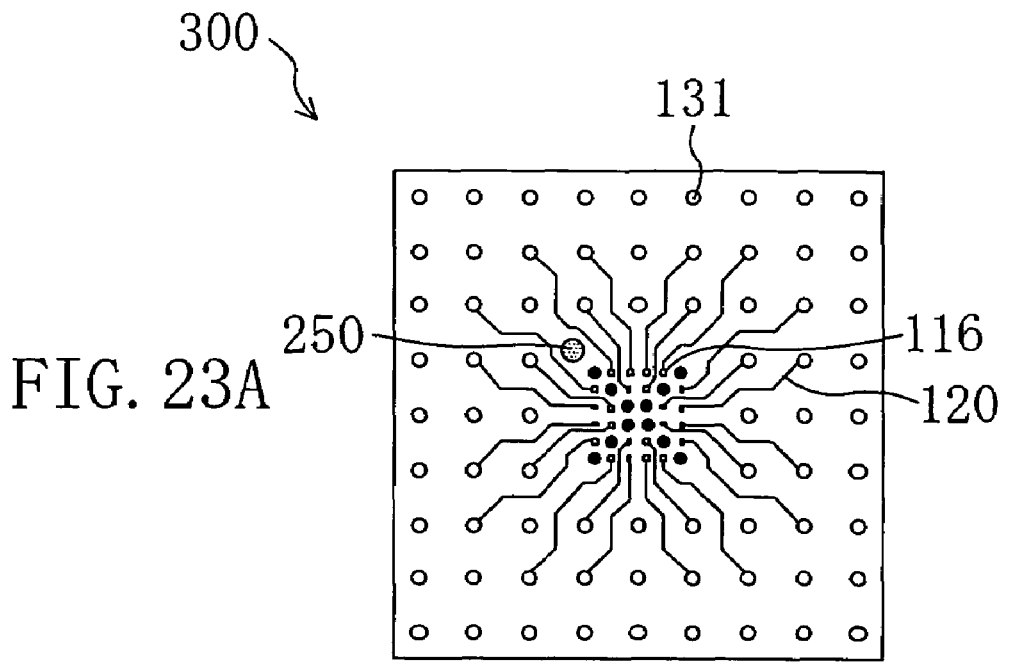
FIGS. 23A and 23B are views illustrating the upper and lower faces, respectively, of a first resin board for use in a semiconductor module according to a seventh embodiment of the present invention.
Figure 23B:
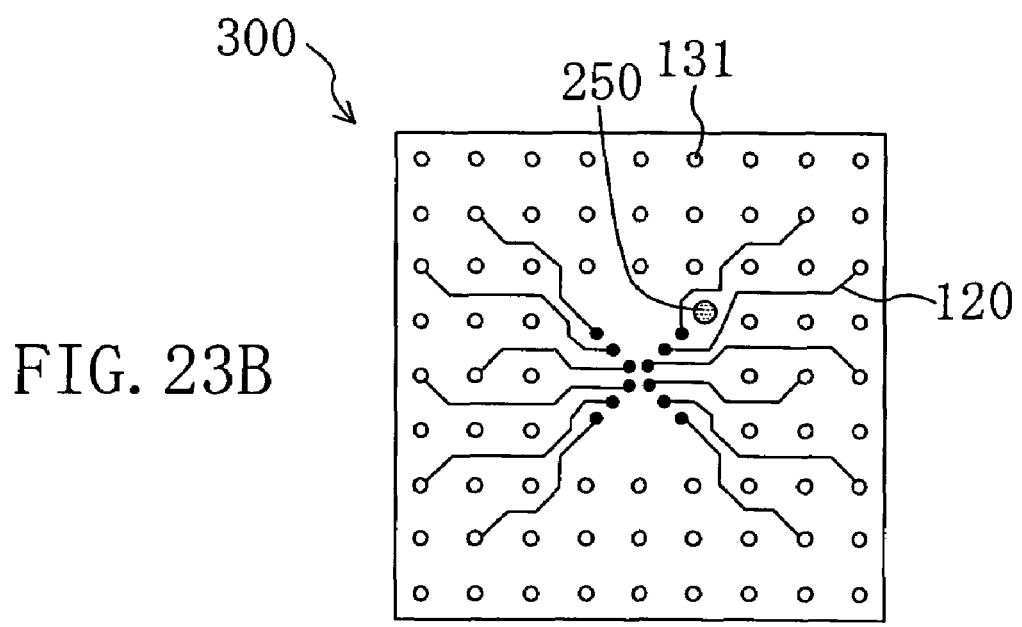

FIGS. 23A and 23B are views illustrating upper and lower faces, respectively, of a first resin board for use in the semiconductor module of the seventh embodiment. In this embodiment, the upper face of a first resin board 300 is a face on which a semiconductor chip 2 is to be mounted.

As illustrated in FIGS. 23A and 23B, the semiconductor module of this embodiment is characterized in that semiconductor-device connecting terminals 110 are collectively provided on a center region on which a semiconductor chip 200 is to be mounted in each of the first resin board 300 and a second resin board (not shown).

Because of this arrangement, wires 120 connecting the semiconductor-device connecting terminals 110 to connection lands 131 are also different from those of the semiconductor module 1 of the first embodiment. Specifically, as illustrated in FIGS. 23A and 23B, in the semiconductor module of this embodiment, the wires 120 are formed on both the upper and lower faces of the resin boards, so that the wires 120 are arranged at a relatively wide pitch with the semiconductor-device connecting terminals 110 arranged at a fine pitch.

Figure 24A:
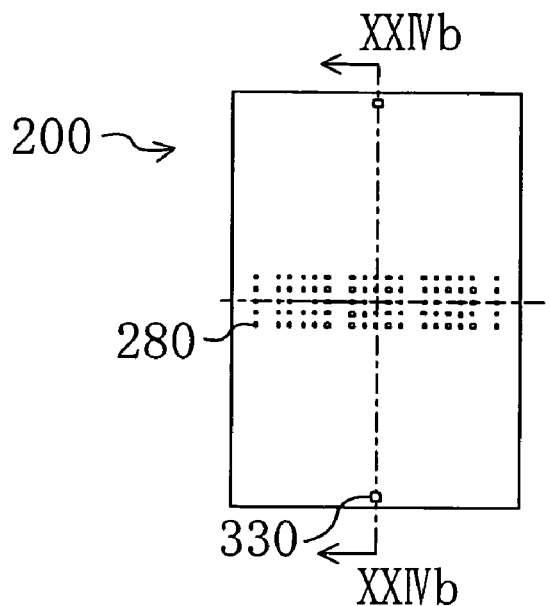
FIGS. 24A and 24B are a plan view of a semiconductor chip to be mounted on a first resin board according to the seventh embodiment and a cross-sectional view of the first resin board taken along the line XXIVb-XXIVb shown in FIG. 24A, respectively.
Figure 24B:
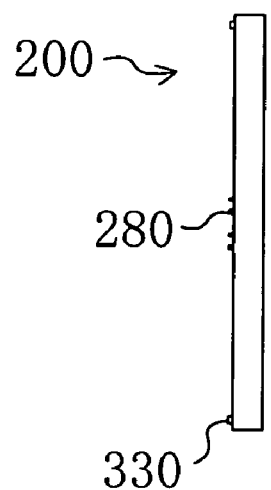

FIGS. 24A and 24B are a plan view of a semiconductor chip 200 to be mounted on a first resin board according to this embodiment and a cross-sectional view of the semiconductor chip taken along the line XXIVb-XXIVb of the first resin board shown in FIG. 24A, respectively. As illustrated in FIGS. 24A and 24B, electrode bumps 280 are collectively formed on a center portion of the semiconductor chip 200 and auxiliary projections 330 having the same height are provided at both ends in the length direction.

Figure 25:
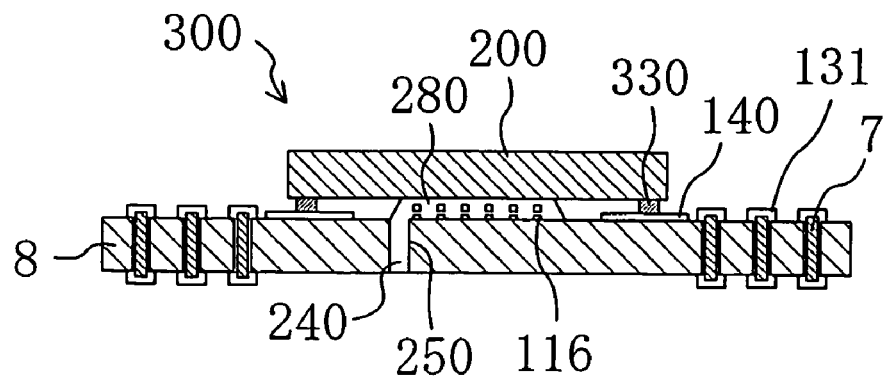
FIG. 25 is a cross-sectional view illustrating a state in which the semiconductor chip of the seventh embodiment is mounted on the first resin board.

FIG. 25 is a cross-sectional view illustrating a state in which the semiconductor chip 200 of this embodiment is mounted on the first resin board 300. As illustrated in FIG. 25, in mounting the semiconductor chip 200, the semiconductor chip 200 is placed on the first resin board 300 and the electrode bumps 280 and the semiconductor-device connecting terminals 110 are bonded together with solder or a conductive adhesive. In positioning for this bonding, the auxiliary projections 330 of the semiconductor chip 200 prevent the semiconductor chip 200 from being tilted so that the semiconductor chip 200 and the first resin board 300 are bonded together, being in parallel with each other with high accuracy. In addition, the auxiliary projections 330 also prevents occurrence of cracks and other failures even upon application of a load to the semiconductor chip 200.

After the mounting, a gap between the first resin board 300 and the semiconductor chip 200 is filled with a liquid resin 240 containing an inorganic filler and sealed. If through holes 250 are previously formed near semiconductor-device connecting terminals 11 of the first resin board 300, the liquid resin 240 is easily injected from the back surface after the semiconductor chip is mounted. If dummy electrodes 140 are provided at positions corresponding to the auxiliary projections 330 of the semiconductor chip 200, the semiconductor chip 200 and the first resin board 300 are kept in parallel with each other with higher accuracy. The sealing using the liquid resin 240 is not necessarily performed and may be omitted. Alternatively, after sealing with the liquid resin 240, a peripheral portion including the auxiliary projections 330 may be encapsulated using a more flexible resin material. The use of a flexible material enables absorption of stress caused by a difference in linear expansion coefficient.

In each of the first resin boards 300, the semiconductor-device connecting terminals 110, the connection lands 131, the wires 120, the dummy electrodes 140 are formed on a first resin base 80 and first buried conductors 7 are formed in the first resin base 80. The first resin boards 300 or a second resin board (not shown) formed in the same manner as the first resin boards 300 and sheet members of a shape associated with the arrangement of the resin boards are alternately stacked and united with application of heat and pressure, thereby completing a semiconductor module according to this embodiment (not shown).

In the multilevel semiconductor module of this embodiment thus fabricated, each of the semiconductor chips 200 is in contact with the first resin board 300 or the second resin board (not shown) in a small contact area and the contact portions are collectively arranged, so that a warp of the bimetal structure caused by the difference in linear expansion coefficient between the semiconductor chip 200 and the first resin board 300 (or the second resin board) is effectively suppressed.

Embodiment 8

Figure 26:
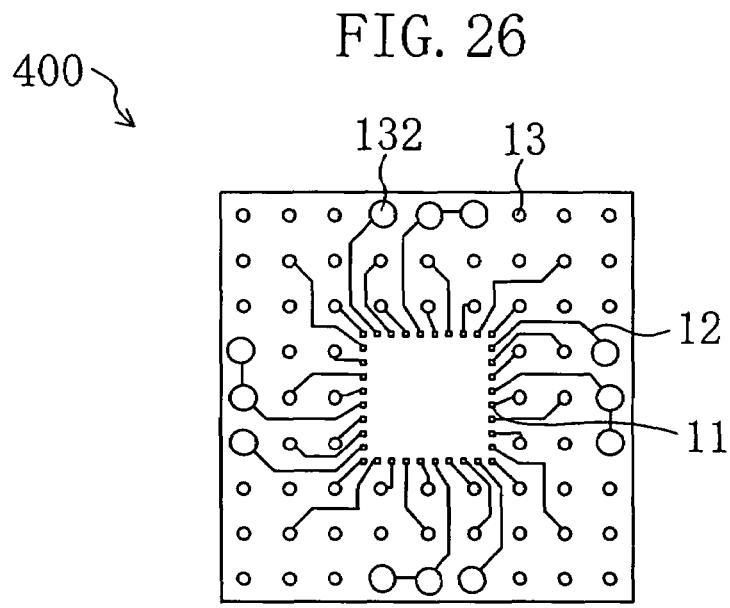
FIG. 26 is a plan view illustrating a first resin board used in a semiconductor module according to an eighth embodiment of the present invention.

A multilevel semiconductor module according to an eighth embodiment of the present invention will be described with reference to FIG. 26. FIG. 26 is a plan view illustrating a first resin board 400 used in the semiconductor module of this embodiment.

As illustrated in FIG. 26, the semiconductor module of this embodiment is characterized in that the diameter of first buried conductors 132 connected to electrode bumps on a semiconductor chip is larger than that of the other first buried conductors 7. In this embodiment, the electrode bumps are previously formed and are input/output terminals requiring high-speed operation (e.g., transmission of digital signals at 100 MHz or higher) of, for example, the semiconductor chip, power-supply terminals, ground terminals and analog terminals, for example. The resistances and impedances of these terminals need to be reduced so as to form stable lines. On the other hand, the electrode bumps and wires connected to the bumps need to be densely arranged, so that it is necessary to reduce the diameters of wires and vias for the other terminals as much as possible according to signal characteristics. In this embodiment, the diameter of first buried conductors (not shown) forming transmission lines connected to input/output terminals requiring high-speed operation of a semiconductor chip, power sources, ground terminals and analog terminals, for example, and the diameter of connection lands 131 formed around the first buried conductors are increased.

Though not shown, the diameter of associated second buried conductors in sheet members is also large. The first resin boards 400 having the foregoing structure, a second resin board 4 and sheet members 5 are stacked and subjected to application of pressure and heat in the same manner as in the fabrication method of the first embodiment, thereby obtaining a multilevel semiconductor module (not shown) of this embodiment.

In the semiconductor module of this embodiment, in the case of requiring transmission lines for transmitting/receiving high-speed signals or analog signals out of signals processed through input/output terminals on semiconductor chips, electric signals are transmitted/received with stability because the diameters of first and second buried conductors forming part of the transmission lines are larger than those of the others. In particular, in a stacked structure, problems such as the difference in diameter between conductors and holes for burying the conductors, formation of insufficient junction at buried conductor portions, and variation of connection resistance because of, for example, a warp might arise in each of stacked resin boards and sheet members. Accordingly, impedance can vary among the levels and signals can be reflected because of mismatching among the levels, resulting in the possibility of variation in characteristics. However, in the semiconductor module of this embodiment, such problems are prevented. In addition, resistance components on transmission lines are reduced, thus suppressing heat generation inside the module caused by Joule heat.

In the first through eighth embodiments, examples in which a glass-epoxy resin, for example, is used as the first resin board 400 are mainly described. However, the present invention is not limited to this. For example, a mixture containing 70 wt % to 95 wt % of an inorganic filler and a thermosetting resin may be used for the first resin bases 8 forming the first and second resin boards 400 and 4 or the second resin bases 16 forming the sheet members 5. The use of such a material allows thermal expansion coefficients of the resin boards to approach that of semiconductor chips, and thus the present invention is effective in suppressing a warp.

Embodiment 9

Hereinafter, a multilevel semiconductor module 160 according to a ninth embodiment of the present invention will be described with reference to FIG. 27, FIGS. 28A through 28D and FIGS. 29A through 29D.

Figure 27:
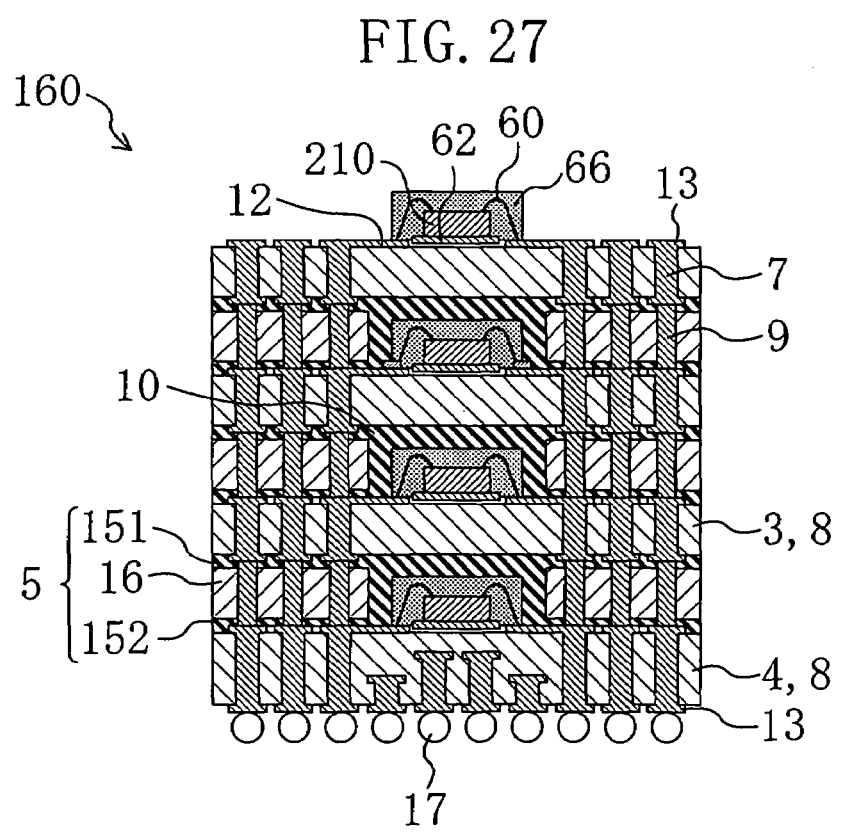
FIG. 27 is a cross-sectional view illustrating a semiconductor module according to a ninth embodiment.

FIG. 27 is a cross-sectional view illustrating the multilevel semiconductor module 160 of this embodiment. In FIG. 27, the thicknesses and lengths, for example, of components of the semiconductor module are selected so as to be easily shown, and therefore are different from those of actual components. The numbers and shapes of buried conductors and external connection terminals for external connection are different from those of actual conductors and terminals and are selected to be easily shown in the drawings.

The semiconductor module 160 of this embodiment is formed by alternately stacking first resin boards 3 on which semiconductor chips 210 are respectively mounted and sheet members 5. In the semiconductor module 160, the resin board at the bottom (i.e., a second resin board 4) is thicker than the other resin boards and solder balls 17 serving as external connection terminals are provided on the lower face of the second resin board 4.

Each of the sheet members 5 includes: a second resin base 16 in which an opening 10 for accommodating a semiconductor chip 210 is formed in a center portion; a first adhesive member 151 covering the side and upper faces of the semiconductor chip 210 encapsulated in a resin in a center region; a second adhesive member 152 formed on the lower face of the second resin base 16 and fused with the first adhesive member 151 in the center region to cover the side and upper faces of the resin-encapsulated semiconductor chip 210; and second buried conductors 9 penetrating the second resin base 16, the first adhesive member 151 and the second adhesive member 152.

Each of the first resin boards 3 includes: a first resin base 8; a plurality of semiconductor-device connecting terminals (not shown) formed on the upper face of the first resin base 8 and connected to the principal surface of the semiconductor chip 210; a plurality of first buried conductors 7 formed in an area of the first resin base 8 around the perimeter thereof and penetrating the first resin base 8; a plurality of connection lands 13 provided on both faces of the first resin base 8 and around both ends of the respective buried conductors 7; and a plurality of wires 12 connecting predetermined ones of the semiconductor-device connecting terminals to associated ones of the connection lands 13 and the first buried conductors 7. Connection lands 13 are also provided on both faces of the second resin board 4 and wires 12 and semiconductor-device connecting terminals are provided on the upper face of the second resin board 4 in the same manner as on the upper face of the first resin boards 3.

The semiconductor module 160 of this embodiment is characterized in that the back surfaces of the respective semiconductor chips 210 are bonded to the first resin boards 3 and the second resin board 4 with an insulating fixing agent 62, and the principal surfaces of the semiconductor chips 210 are connected to the semiconductor-device connecting terminals with fine metal wires 60. The principal surface of each of the semiconductor chips 210 and the fine metal wires 60 are encapsulated in an encapsulating resin 66 smaller than the opening 10 in plan view and thinner than the second resin base 16. As described later, the semiconductor chips 210 are mounted on the resin boards by a conventional die bonding method and a conventional wire bonding method.

In the semiconductor module 160 of this embodiment, sheet members as described in the second and third embodiments may be used instead of the sheet members as described in the first embodiment. The materials and structures of the adhesive members and resin bases are the same as those in the first embodiment, and description thereof will be omitted.

As described above, the structure of the semiconductor module of this embodiment is applicable to a case in which the semiconductor chips 210 are connected to the terminals on the resin boards using the fine metal wires 60.

Now, a process of forming a resin-molded semiconductor chip 210 mounted on a resin board will be described with reference to FIGS. 28A through 28D. FIGS. 28A through 28D are cross-sectional views showing a method for forming a first resin board 3 provided with a resin-molded semiconductor chips 210 in the semiconductor module of this embodiment.

Figure 28A:
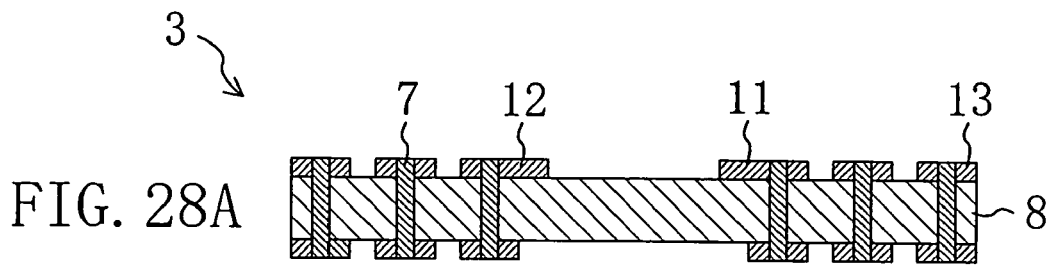
FIGS. 28A through 28D are cross-sectional views showing a method for forming a first resin board provided with a resin-molded semiconductor chip in the semiconductor module of the ninth embodiment.

First, as shown in FIG. 28A, a first resin board 3 (or a second resin board 4) each provided with semiconductor-device connecting terminals 11, wires 12, connection lands 13 and first buried conductors 7, for example, is prepared.

Figure 28B:
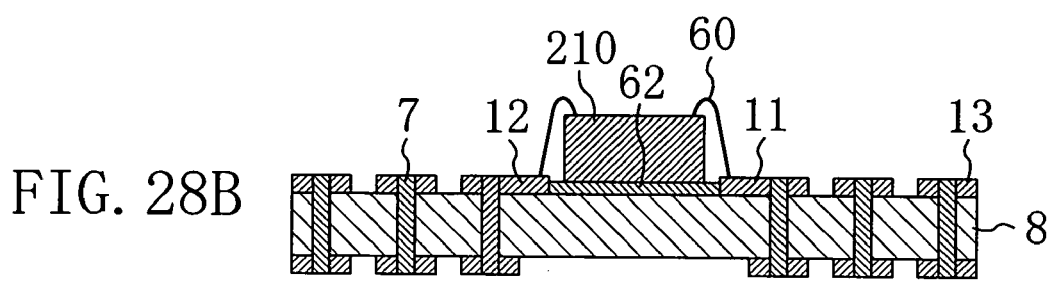

Next, as shown in FIG. 28B, a center region of the upper face of the first resin board 3 is coated with an insulating fixing agent 62 and a semiconductor chip 210 is placed thereon. Thereafter, die bonding is performed with heat. Subsequently, terminals on the principal surface of the semiconductor chip 210 and the semiconductor-device connecting terminals 11 on the first resin board 3 are connected to each other by a conventional wire bonding method using fine metal wires 60 made of, for example, gold, copper or aluminum.

Figure 28C:
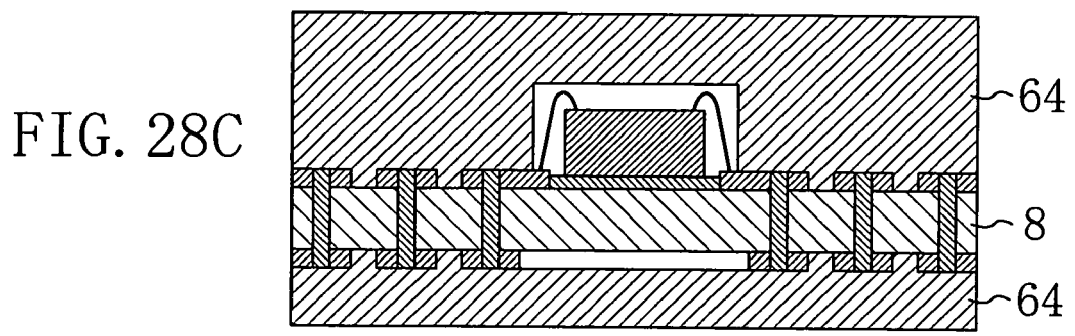

Then, as show in FIG. 28C, a resin-molding die 64 having a cavity capable of accommodating the semiconductor chip 210, the fine metal wires 60 and the semiconductor-device connecting terminals 11 is pressed onto the first resin board 3. In this process step, the resin-molding die 64 and the first resin board 3 are kept at a temperature at which the encapsulating resin 66 is melted.

Figure 28D:
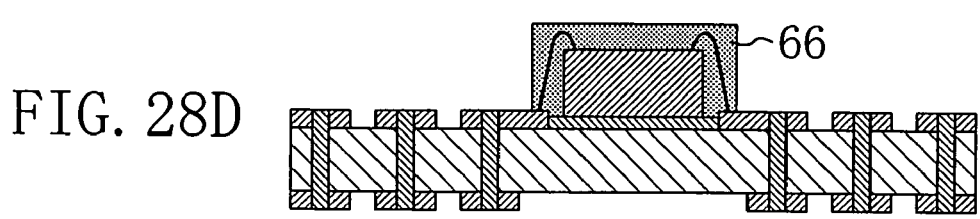

Thereafter, as shown in FIG. 28D, the encapsulating resin 66 is injected into the cavity of the resin-molding die 64. After the injection, the resin-molding die 64 is held for a given time until the encapsulating resin 66 is hardened. Then, the resin-molding die 64 is removed. In this manner, a first resin board 3 used in the semiconductor module 160 of this embodiment is obtained.

As a modified example of the semiconductor module 160 of this embodiment, instead of the resin-molding die 64, a liquid encapsulating resin 68 may be used for encapsulating the semiconductor chip 210 and the fine metal wires 60.

Hereinafter, a process of forming a first resin board 3a on which an encapsulated semiconductor chip 210 is to be mounted and which is used in the semiconductor module 160 of the modified example of this embodiment will be described with reference to FIGS. 29A through 29D. FIGS. 29A through 29D are cross-sectional views showing a method for forming a first resin board 3a on which a semiconductor chip 210 is mounted in the semiconductor module of the modified example of this embodiment.

Figure 29A:
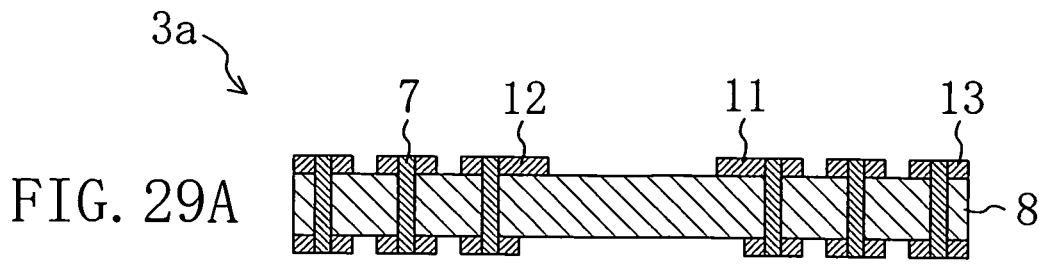
FIGS. 29A through 29D are cross-sectional views showing a method for forming a first resin board on which a semiconductor chip is mounted in a semiconductor module according to a modified example of the ninth embodiment.
Figure 29B:
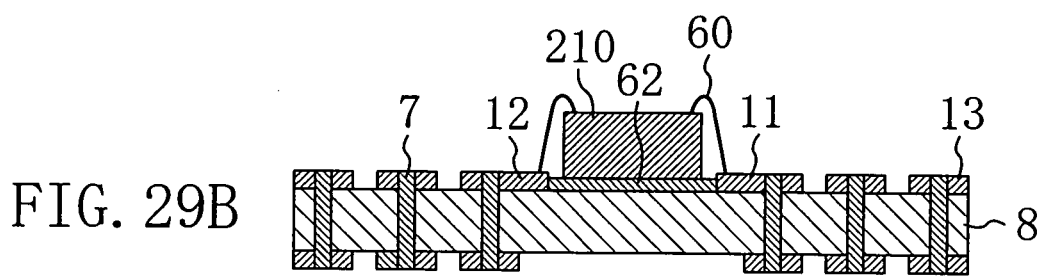

The process steps shown in FIGS. 29A and 29B are the same as those shown in FIGS. 28A and 28B, and description thereof will be omitted.

Figure 29C:
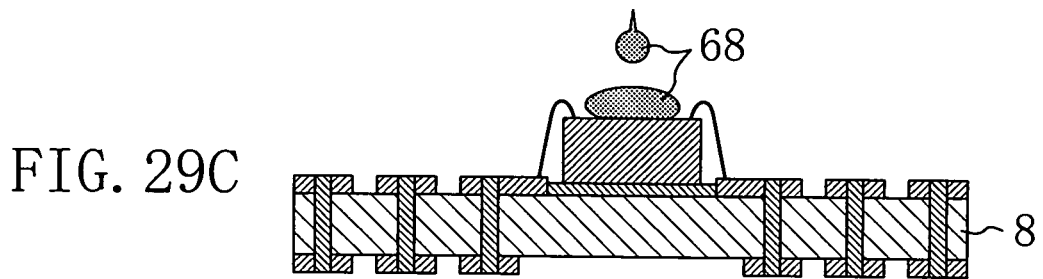

Then, as shown in FIG. 29C, a liquid encapsulating resin 68 having an appropriate viscosity and kept in a syringe is dropped from the tip of a needle thereof with pressure and time adjusted, thereby covering the semiconductor chip 210, fine metal wires 60 and semiconductor-device connecting terminals 11 with the liquid encapsulating resin 68. At this time, the amount of dropped liquid encapsulating resin 68 is adjusted such that the encapsulated body is smaller than the area of the opening 10 in the second resin base 16 and is thinner than the second resin base 16.

Figure 29D:
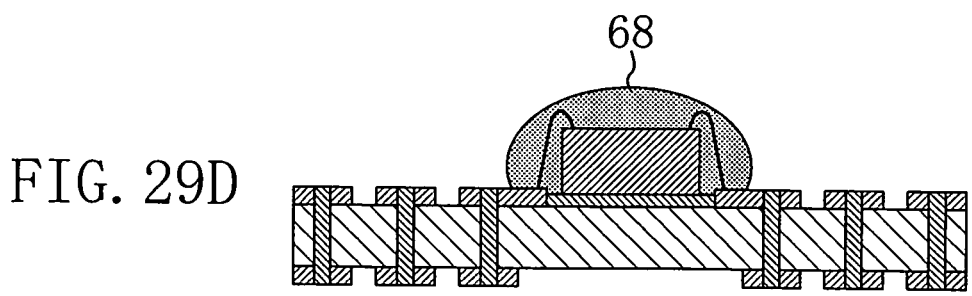

Thereafter, as shown in FIG. 29D, the applied liquid encapsulating resin 68 is hardened with heat with the temperature and time adjusted so as to ensure hardening of the liquid encapsulating resin 68. In this manner, a first resin board 3a forming a semiconductor module (not shown) of this modified example is obtained.

As described above, the semiconductor chips 210 and the fine metal wires 60 mounted on the first resin boards 3 are subjected to pre-molding by die molding or potting encapsulation beforehand, so that a warp occurring in the semiconductor module is suppressed. In addition, even when a load is applied to the semiconductor chips 210, occurrence of cracks and other failures is prevented. As the semiconductor modules of the foregoing embodiments, the semiconductor module of this embodiment exhibits excellent moisture resistance.

In a multilevel semiconductor module according to the present invention, the occurrence of a warp is suppressed and the module is coupled to a mother board with high yield. Accordingly, the multilevel semiconductor module is useful for size reduction and functional enhancement of various electronic devices such as cellular phones and digital cameras.

What is claimed is:

1. A multilevel semiconductor module formed by alternately stacking resin boards and sheet members, each of the resin boards including a first resin base and one or more first buried conductors penetrating the first resin base, a semiconductor chip being mounted on an upper face of each of the resin boards, each of the sheet members including a second resin base having an opening for accommodating the semiconductor chip and one or more second buried conductors penetrating the second resin base and electrically connected to the first buried conductors, the multilevel semiconductor module comprising an adhesive member covering upper and side faces of the semiconductor chip,
wherein one of the resin boards located at the bottom has a thickness larger than that of each of the other resin board or boards, and
the adhesive member is a part of each of the sheet members, is provided on at least one of upper and lower faces of the second resin base, and covers the upper and side faces of the semiconductor chip in a region overlapping with the opening of the second resin base when viewed from above.

2. The multilevel semiconductor module of claim 1, wherein the adhesive member is provided on one of the upper and lower faces of the second resin base, and
each of the sheet members further includes a first adhesive layer which is provided on a region of the other face of the second resin base surrounding the opening when viewed from above and bonds the first resin base and the second resin base together.

3. The multilevel semiconductor module of claim 1, wherein a portion of the adhesive member overlapping with the opening when viewed from above has a thickness larger than that in the other portion of the adhesive member.

4. A multilevel semiconductor module formed by alternately stacking resin boards and sheet members, each of the resin boards including a first resin base and one or more first buried conductors penetrating the first resin base, a semiconductor chip being mounted on an upper face of each of the resin boards, each of the sheet members including a second resin base having an opening for accommodating the semiconductor chip and one or more second buried conductors penetrating the second resin base and electrically connected to the first buried conductors, the multilevel semiconductor module comprising an adhesive member covering upper and side faces of the semiconductor chip,
wherein one of the resin boards located at the bottom has a thickness larger than that of each of the other resin board or boards,
each of the sheet members further includes a second adhesive layer provided on a region of at least one of upper and lower faces of the second resin base surrounding the opening when viewed from above, and
the adhesive member is made of a low-stress resin having a softening point lower than that of the second adhesive member and a stiffness lower than that of the second adhesive layer.

5. A multilevel semiconductor module formed by alternately stacking resin boards and sheet members, each of the resin boards including a first resin base and one or more first buried conductors penetrating the first resin base, a semiconductor chip being mounted on an upper face of each of the resin boards, each of the sheet members including a second resin base having an opening for accommodating the semiconductor chip and one or more second buried conductors penetrating the second resin base and electrically connected to the first buried conductors, the multilevel semiconductor module comprising an adhesive member covering upper and side faces of the semiconductor chip,
wherein one of the resin boards located at the bottom has a thickness larger than that of each of the other resin board or boards, and
at least one of the semiconductor chip mounted on the resin board at the bottom and the semiconductor chip mounted on the resin board at the top out of the resin boards has a thickness larger than that of each of the other semiconductor chip or chips mounted on the other resin board or boards.

6. A multilevel semiconductor module formed by alternately stacking resin boards and sheet members, each of the resin boards including a first resin base and one or more first buried conductors penetrating the first resin base, a semiconductor chip being mounted on an upper face of each of the resin boards, each of the sheet members including a second resin base having an opening for accommodating the semiconductor chip and one or more second buried conductors penetrating the second resin base and electrically connected to the first buried conductors, the multilevel semiconductor module comprising an adhesive member covering upper and side faces of the semiconductor chip,
wherein one of the resin boards located at the bottom has a thickness larger than that of each of the other resin board or boards,
said semiconductor module further comprising a rigid plate having a thermal conductivity higher than those of the resin boards and a stiffness higher than those of the resin boards, the rigid plate being placed over one of the resin boards located at the top.

7. A multilevel semiconductor module formed by alternately stacking resin boards and sheet members, each of the resin boards including a first resin base and one or more first buried conductors penetrating the first resin base, a semiconductor chip being mounted on an upper face of each of the resin boards, each of the sheet members including a second resin base having an opening for accommodating the semiconductor chip and one or more second buried conductors penetrating the second resin base and electrically connected to the first buried conductors, the multilevel semiconductor module comprising an adhesive member covering upper and side faces of the semiconductor chip,
wherein one of the resin boards located at the bottom has a thickness larger than that of each of the other resin board or boards, and
the diameter of each of the first buried conductors which are provided in the resin board or boards except for the resin boards located at the bottom and the top and the diameter of each of the second buried conductors which are in contact with the first buried conductors provided in the resin board or boards except for the resin boards located at the bottom and the top are larger than that of each of the first buried conductors which are provided in the resin boards located at the bottom and the top.

8. A multilevel semiconductor module formed by alternately stacking resin boards and sheet members, each of the resin boards including a first resin base and one or more first buried conductors penetrating the first resin base, a semiconductor chip being mounted on an upper face of each of the resin boards, each of the sheet members including a second resin base having an opening for accommodating the semiconductor chip and one or more second buried conductors penetrating the second resin base and electrically connected to the first buried conductors, the multilevel semiconductor module comprising an adhesive member covering upper and side faces of the semiconductor chip, wherein one of the resin boards located at the bottom has a thickness larger than that of each of the other resin board or boards, the semiconductor chip is mounted on each of the resin boards with a principal surface of the semiconductor chip facing the resin board, one or more electrode bumps are provided on a center region of the principal surface of the semiconductor chip, each of the resin boards further includes: one or more connection terminals bonded to the electrode bumps; connection lands connected to both ends of each of the first buried conductors; and wires connecting the connection terminals and the connection lands to each other and provided on upper and lower faces of each of the resin boards, the semiconductor chip further includes projections having a substantially identical height and located at both ends of the principal surface, and each of the resin boards further includes one or more dummy electrodes in contact with the projections.

9. A multilevel semiconductor module formed by alternately stacking resin boards and sheet members, each of the resin boards including a first resin base and one or more first buried conductors penetrating the first resin base, a semiconductor chip being mounted on an upper face of each of the resin boards, each of the sheet members including a second resin base having an opening for accommodating the semiconductor chip and one or more second buried conductors penetrating the second resin base and electrically connected to the first buried conductors, the multilevel semiconductor module comprising an adhesive member covering upper and side faces of the semiconductor chip, wherein one of the resin boards located at the bottom has a thickness larger than that of each of the other resin board or boards, the semiconductor chip is mounted on each of the resin boards with a principal surface of the semiconductor chip facing the resin board, one or more electrode bumps are provided on a center region of the principal surface of the semiconductor chip, each of the resin boards further includes: one or more connection terminals bonded to the electrode bumps; connection lands connected to both ends of each of the first buried conductors; and wires connecting the connection terminals and the connection lands to each other and provided on upper and lower faces of each of the resin boards, and each of one or more of the first buried conductors connected to the electrode bumps has a diameter larger than that of each of the other buried conductor or conductors.

10. A multilevel semiconductor module formed by alternately stacking resin boards and sheet members, each of the resin boards including a first resin base and one or more first buried conductors penetrating the first resin base, a semiconductor chip being mounted on an upper face of each of the resin boards, each of the sheet members including a second resin base having an opening for accommodating the semiconductor chip and one or more second buried conductors penetrating the second resin base and electrically connected to the first buried conductors, the multilevel semiconductor module comprising an adhesive member covering upper and side faces of the semiconductor chip, wherein one of the resin boards located at the bottom has a thickness larger than that of each of the other resin board or boards, one or more electrode bumps are provided on a principal surface of the semiconductor chip, each of the resin boards further includes: one or more connection terminals bonded to the electrode bumps; and wires connecting the connection terminals and the first buried conductors to each other, and each of one or more of the first buried conductors connected to the electrode bumps has a diameter larger than that of each of the other buried conductors.

11. A multilevel semiconductor module formed by alternately stacking resin boards and sheet members, each of the resin boards including a first resin base and one or more first buried conductors penetrating the first resin base, a semiconductor chip being mounted on an upper face of each of the resin boards, each of the sheet members including a second resin base having an opening for accommodating the semiconductor chip and one or more second buried conductors penetrating the second resin base and electrically connected to the first buried conductors, the multilevel semiconductor module comprising an adhesive member covering upper and side faces of the semiconductor chip, wherein one of the resin boards located at the bottom has a thickness larger than that of each of the other resin board or boards, the semiconductor chip is mounted on each of the resin boards with a back surface of the semiconductor chip facing the upper face of the resin board, each of the resin boards further includes: one or more connection terminals provided on the upper face thereof; connection lands connected to both ends of each of the first buried conductors; and wires connecting the connection terminals and the connection lands to each other and provided on upper and lower faces of each of the resin boards, the multilevel semiconductor module further comprises: a fine metal wire connecting a principal surface of the semiconductor chip and the connection terminals together; and an encapsulating resin encapsulating the fine metal wire and the principal surface of the semiconductor chip and having a thickness smaller than that of the second resin board, and the adhesive member covers side and upper faces of each of the encapsulating resin.

12. A multilevel semiconductor module formed by alternately stacking resin boards and sheet members, each of the resin boards including a first resin base and one or more first buried conductors penetrating the first resin base, a semiconductor chip being mounted on an upper face of each of the resin boards, each of the sheet members including a second resin base having an opening for accommodating the semiconductor chip and one or more second buried conductors penetrating the second resin base and electrically connected to the first buried conductors, the multilevel semiconductor module comprising an adhesive member covering upper and side faces of the semiconductor chip, wherein one of the resin boards located at the bottom has a thickness larger than that of each of the other resin board or boards, and the first resin base forming each of the resin boards is made of a mixture containing 70 wt % to 95 wt %, both inclusive, of an inorganic filler and a thermosetting resin.

13. A method for fabricating a multilevel semiconductor module, the method comprising the steps of:

(a) preparing one or more first resin boards, a second resin board and one or more sheet members, each of the first resin boards having an upper face on which a semiconductor chip is mounted and including one or more first buried conductors, the second resin board having an upper face on which a semiconductor chip is mounted, including one or more first buried conductors and having a thickness larger than that of each of the first resin boards, each of the sheet members including a resin base having an opening larger than the semiconductor chip when viewed from above, an adhesive member placed on at least one of upper and lower faces of the resin base and one or more second buried conductors penetrating the resin base;

(b) placing the second resin board at the bottom and alternately stacking the sheet members and the first resin boards over the second resin board so that the semiconductor chip is housed in the opening; and (c) applying heat and pressure to the first and second resin boards and the sheet members stacked at the step (b) from the bottom and the top of the stacked structure so as to bond the first and second resin boards and the sheet members together, connect the first buried conductors and the second buried conductors to each other, and cause the adhesive member to flow so that the semiconductor chip is covered with the adhesive member.

14. The method of claim 13, wherein in the step (b), the adhesive member is placed on each of the upper and lower faces of the resin base.

15. The method of claim 13, wherein in the step (b), the adhesive member is provided on one of the upper and lower faces of the resin base, each of the sheet members further includes a first adhesive layer provided on the other face of the resin base in a region surrounding the opening when viewed from above, and the first adhesive layer is used for bonding the resin base and an associated one of the first resin boards and the second resin board together.

16. The method of claim 13, further comprising the step (d) of bonding a rigid plate having a thermal conductivity higher than that of each of the first and second resin boards, over one of the first resin boards located at the top, after the step (c).

17. The method of claim 16, wherein in the step (d), the amount of a warp of the multilevel semiconductor module occurring in the step (c) is obtained, and a material for the rigid plate and the thickness of the rigid plate are selected according to the obtained amount.

18. The method of claim 13, further comprising the step of placing a rigid plate having a thermal conductivity higher than that of each of the first and second resin boards, over one of the first resin boards located at the top, after the step (b) and before the step (c).

19. The method of claim 13, wherein the step (a) includes the steps of:

(a1) mounting the semiconductor chip on each of the resin boards with a back surface of the semiconductor chip facing the resin board;

(a2) forming a fine metal wire connecting one or more connection terminals provided on each of the resin boards and a principal surface of the associated semiconductor chip to each other; and (a3) molding an encapsulating resin for encapsulating the fine metal wire and the principal surface of the semiconductor chip, using a die.

20. The method of claim 13, wherein the step (a) includes the steps of:

(a1) mounting the semiconductor chip on each of the resin boards with a back surface of the semiconductor chip facing the resin board;

(a2) forming a fine metal wire connecting one or more connection terminals provided on each of the resin boards and a principal surface of the associated semiconductor chip to each other; and (a4) dropping an encapsulating resin in a liquid state on the principal surface of the semiconductor chip so that the fine metal wire and the principal surface of the semiconductor chip are encapsulated.

21. A method for fabricating a multilevel semiconductor module, the method comprising the steps of:

(a) preparing one or more first resin boards, a second resin board, one or more sheet members and one or more low-stress members, each of the first resin boards having an upper face on which a semiconductor chip is mounted and including one or more first buried conductors, the second resin board having an upper face on which a semiconductor chip is mounted, including one or more first buried conductors and having a thickness larger than that of each of the first resin boards, each of the sheet members including a resin base having an opening larger than the semiconductor chip when viewed from above, adhesive layers placed on upper and lower faces of the resin base in respective regions surrounding the opening when viewed from above and one or more second buried conductors penetrating the resin base, each of the low-stress members being made of a resin having a softening point lower than that of each of the adhesive layers and a stiffness lower than that of each of the adhesive layers, each of the low-stress members being smaller than the opening when viewed from above;

(b) placing the second resin board at the bottom, alternately stacking the sheet members and the first resin boards over the second resin board so that the semiconductor chip is housed in the opening, and placing the low-stress members on associated ones of the semiconductor chips; and (c) applying heat and pressure to the first and second resin boards and the sheet members stacked at the step (b) from the bottom and the top to cause the low-stress members to flow so that the semiconductor chips are covered with the respective low-stress members, and (d) heating the first and second resin boards and the sheet members stacked at the step (b) from the bottom and the top to a temperature higher than a temperature at the step (c) with application of pressure, thereby bonding the first and second resin boards and the sheet members together and connecting the first buried conductors and the second buried conductors to each other.

* * * * *